(12) United States Patent
Barth et al.

(10) Patent No.: US 7,571,330 B2
(45) Date of Patent: *Aug. 4, 2009

(54) SYSTEM AND MODULE INCLUDING A MEMORY DEVICE HAVING A POWER DOWN MODE

(75) Inventors: Richard M. Barth, Palo Alto, CA (US); Ely K. Tsern, Los Altos, CA (US); Craig E. Hampel, San Jose, CA (US); Frederick A. Ware, Los Altos Hills, CA (US); Todd W. Bystrom, Sunnyvale, CA (US); Bradley A. May, San Jose, CA (US); Paul G. Davis, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 100 days.

This patent is subject to a terminal disclaimer.

(21) Appl. No.: 11/137,469

(22) Filed: May 25, 2005

(65) Prior Publication Data

US 2005/0216654 A1    Sep. 29, 2005

Related U.S. Application Data

(63) Continuation of application No. 11/030,231, filed on Jan. 6, 2005, now abandoned, which is a continuation of application No. 10/993,046, filed on Nov. 19, 2004, which is a continuation of application No. 09/685,014, filed on Oct. 5, 2000, now Pat. No. 6,842,864, which is a continuation of application No. 09/038,358, filed on Mar. 10, 1998, now Pat. No. 6,154,821.

(51) Int. Cl.
G06F 1/00      (2006.01)
G06F 13/00     (2006.01)

(52) U.S. Cl. .................. 713/300; 713/323; 711/167
(58) Field of Classification Search ................. 713/300, 713/324, 323, 330; 711/5, 167, 170
See application file for complete search history.

(56) References Cited

U.S. PATENT DOCUMENTS 4,627,060 A    12/1986    Huang
4,710,903 A    12/1987    Hereth (Continued)

OTHER PUBLICATIONS

Non-final Office Action, United States Patent & Trademark Office, U.S. Appl. No. 11/030,382, filed Jan. 6, 2005, Jul. 27, 2007.

(Continued)

*Primary Examiner*—Suresh K Suryawanshi
(74) *Attorney, Agent, or Firm*—Vierra Magen Marcus & DeNiro LLP

(57) ABSTRACT

A memory module comprises a memory device including a memory array to store data. An interface receives an instruction to exit a power down mode. A register stores a value representative of a period of time to elapse between exiting from the power down mode and a time at which the memory device is capable of receiving a command to access the data. A storage device stores a plurality of parameter information that pertains to the memory device. The value is based on at least a first parameter information of the plurality of parameter information.

30 Claims, 19 Drawing Sheets

U.S. PATENT DOCUMENTS

| | | | |
|---|---|---|---|
| 4,965,799 A | 10/1990 | Green et al. | |
| 5,243,703 A | 9/1993 | Farmwald et al. | |
| 5,301,278 A | 4/1994 | Bowater et al. | |
| 5,307,320 A | 4/1994 | Farrer et al. | |
| 5,392,407 A | 2/1995 | Hell et al. | |
| 5,432,823 A | 7/1995 | Gasbarro et al. | |
| 5,454,114 A * | 9/1995 | Yach et al. | 713/330 |
| 5,457,790 A | 10/1995 | Iwamura et al. | |
| 5,509,138 A | 4/1996 | Cash et al. | |
| 5,559,753 A | 9/1996 | Kocis | |
| 5,585,745 A | 12/1996 | Simmons et al. | |
| 5,586,332 A | 12/1996 | Jain et al. | |
| 5,596,545 A | 1/1997 | Lin | |
| 5,606,717 A | 2/1997 | Farnwald et al. | |
| 5,608,896 A | 3/1997 | Vogley | |
| 5,615,169 A | 3/1997 | Leung | |
| 5,629,897 A | 5/1997 | Iwamoto et al. | |
| 5,638,334 A | 6/1997 | Farnwald et al. | |
| 5,655,113 A | 8/1997 | Leung et al. | |
| 5,657,481 A | 8/1997 | Farnwald et al. | |
| 5,666,324 A | 9/1997 | Kosugi et al. | |
| 5,673,398 A | 9/1997 | Takeda | |
| 5,677,849 A | 10/1997 | Smith | |
| 5,696,729 A | 12/1997 | Kitamura | |
| 5,701,438 A | 12/1997 | Bains | |
| 5,717,639 A | 2/1998 | Williams et al. | |
| 5,742,194 A | 4/1998 | Saeki | |
| 5,754,838 A | 5/1998 | Shibata et al. | |
| 5,778,413 A | 7/1998 | Stevens et al. | |
| 5,790,839 A | 8/1998 | Luk et al. | |
| 5,796,673 A | 8/1998 | Foss | |
| 5,815,462 A | 9/1998 | Konishi et al. | |
| 5,835,448 A | 11/1998 | Ohtani et al. | |
| 5,845,108 A | 12/1998 | Yoo et al. | |
| 5,848,025 A | 12/1998 | Marietta et al. | |
| 5,860,125 A | 1/1999 | Reents | |
| 5,880,998 A | 3/1999 | Tanimura et al. | |
| 5,886,946 A | 3/1999 | Ooishi | |
| 5,886,948 A | 3/1999 | Ryan | |
| 5,889,726 A | 3/1999 | Jeddeloh | |
| 5,892,777 A | 4/1999 | Nesheiwat et al. | |
| 5,893,168 A | 4/1999 | Qureshi et al. | |
| 5,896,383 A | 4/1999 | Wakeland | |
| 5,897,663 A | 4/1999 | Stancil | |
| 5,910,930 A | 6/1999 | Dieffenderfer | |
| 5,917,760 A | 6/1999 | Millar | |
| 5,920,511 A | 7/1999 | Lee et al. | |
| 5,925,132 A * | 7/1999 | Kadokura | 713/323 |
| 5,930,197 A | 7/1999 | Ishibashi et al. | |
| 5,931,951 A * | 8/1999 | Ando | 713/324 |
| 5,955,904 A | 9/1999 | Kawasaki | |
| 5,966,725 A | 10/1999 | Tabo | |
| 5,987,576 A | 11/1999 | Johnson et al. | |
| 6,014,339 A | 1/2000 | Kobayashi et al. | |
| 6,067,272 A | 5/2000 | Foss et al. | |
| 6,088,774 A | 7/2000 | Gillingham | |
| 6,092,146 A * | 7/2000 | Dell et al. | 711/5 |
| 6,128,700 A | 10/2000 | Hsu et al. | |
| 6,134,638 A | 10/2000 | Olarig et al. | |
| 6,151,269 A | 11/2000 | Dosaka et al. | |
| 6,154,821 A * | 11/2000 | Barth et al. | 711/170 |
| 6,209,071 B1 * | 3/2001 | Barth et al. | 711/167 |
| 6,226,723 B1 | 5/2001 | Gustavson et al. | |
| 6,226,754 B1 | 5/2001 | Ware et al. | |
| 6,226,757 B1 | 5/2001 | Ware et al. | |
| 6,259,288 B1 | 7/2001 | Nishimura | |
| 6,263,448 B1 | 7/2001 | Tsern et al. | |
| 6,343,352 B1 | 1/2002 | Davis | |
| 6,401,167 B1 | 6/2002 | Barth et al. | |
| 6,437,619 B2 | 8/2002 | Okuda et al. | |
| 6,442,644 B1 | 8/2002 | Gustavson et al. | |
| 6,697,908 B2 | 2/2004 | Uchiyama et al. | |
| 6,701,446 B2 | 3/2004 | Tsern et al. | |
| 6,868,474 B2 | 3/2005 | Ware | |
| 6,889,300 B2 | 5/2005 | Davis | |
| 7,047,375 B2 | 5/2006 | Davis | |
| 7,197,611 B2 | 3/2007 | Barth | |
| 7,320,082 B2 | 1/2008 | Tsern | |
| 2005/0193183 A1 | 9/2005 | Barth et al. | |

OTHER PUBLICATIONS

Non-final Office Action, United States Patent & Trademark Office, U.S. Appl. No. 11/030,231, filed Jan. 6, 2005, Jul. 25, 2007.
SGS-Thomson, ST24/25C02,ST24C02R, ST24/25W02 Specification, Nov. 1997, pp. 1-16.
Micron, 1997 DRAM Data Book, pp. 1-3 through 1-11 and 5-17 through 5-32.
Non-Final Office Action, United States Patent & Trademark Office, U.S. Appl. No. 11/119,319, filed Apr. 29, 2005, Aug. 10, 2007.
Non-final Office Action, United States Patent & Trademark Office, U.S. Appl. No. 11/151,791, filed Jun. 14, 2005, Sep. 26, 2007.
Response to Non-Final Office Action, U.S. Appl. No. 11/119,319, filed Apr. 29, 2005, May 9, 2008.
Response to Non-Final Office Action, U.S. Appl. No. 11/030,382, filed Jan. 6, 2005, May 19, 2008.
Final Office Action, United States Patent & Trademark Office, U.S. Appl. No. 10/993,046, filed Nov. 19, 2004, May 16, 2008.
Response to Non-Final Office Action, U.S. Appl. No. 11/151,791, filed Jun. 14, 2005, Jun. 10, 2008.
Response to Non-Final Office Action, U.S. Appl. No. 10/944,320, filed Sep. 17, 2004, Jun. 30, 2008.
Non-Final Office Action, United States Patent & Trademark Office, U.S. Appl. No. 11/151,791, filed Jun. 14, 2005, Jul. 31, 2008.
Response to Final Office Action, U.S. Appl. No. 10/993,046, filed Nov. 19, 2004, Aug. 18, 2008.
Final Office Action, United States Patent & Trademark Office, U.S. Appl. No. 11/030,382, filed Jan. 6, 2005, Aug. 14, 2008.
Final Office Action, United States Patent & Trademark Office, U.S. Appl. No. 11/119,319, filed Apr. 29, 2005, Sep. 2, 2008.
Response to Non-Final Office Action, United States Patent & Trademark Office, U.S. Appl. No. 11/151,791, filed Jun. 14, 2005, Sep. 12, 2008.
Non-Final Office Action, United States Patent & Trademark Office, U.S. Appl. No. 10/944,320, filed Sep. 17, 2004, Sep. 30, 2008.
Final Office Action, United States Patent & Trademark Office, U.S. Appl. No. 10/944,320, filed Sep. 17, 2004, Nov. 27, 2007.
Notice of Allowance and Fee(s) Due, United States Patent & Trademark Office, U.S. Appl. No. 11/030,231, filed Jan. 6, 2005, Dec. 6, 2007.
Response to Non-Final Office Action, U.S. Appl. No. 11/030,382, filed Jan. 6, 2005, Dec. 20, 2007.
Response to Non-Final Office Action, U.S. Appl. No. 11/119,319, filed Apr. 29, 2005, Dec. 20, 2007.
Lee, Thomas H., A 2.5V CMOS Delay-Locked Loop for an 18Mbit, 500 Megabyte/s DRAM, IEEE Journal, vol. 29, No. 12, Dec. 1994.
Rambus Inc., "8/9 Mbit (1Mx8/9) & 16/18Mbit (2Mx8/9) RDRAM—Preliminary Information," Rambus Inc. Data Sheet, Mar. 1, 1996, 30 pages.
Direct Rambus Technology Disclosure, Oct. 15, 1997, pp. 1-16.
"16/18Mbit (2Mx8/9) A 64/72Mbit (8Mx8/9) Concurrent RDRAM," Rambus Inc., Sep. 1997.
Non-Final Office Action, United States Patent & Trademark Office, U.S. Appl. No. 11/030,382, filed Jun. 6, 2005, Jan. 17, 2008.
Response to Non-Final Office Action, U.S. Appl. No. 11/151,791, filed Jun. 14, 2005, Jan. 24, 2008.
Response to Final Office Action, U.S. Appl. No. 10/944,320, filed Sep. 17, 2004, Feb. 12, 2008.
Non-Final Office Action, United States Patent & Trademark Office, U.S. Appl. No. 11/119,319, filed Apr. 29, 2005, Feb. 5, 2008.
Response to Non-Final Office Action, U.S. Appl. No. 10/993,046, filed Nov. 19, 2004, Feb. 19, 2008.
Non-Final Office Action, United States Patent & Trademark Office, U.S. Appl. No. 11/030,231, filed Jan. 6, 2005, Mar. 25, 2008.

Non-Final Office Action, United States Patent & Trademark Office, U.S. Appl. No. 11/151,791, filed Jun. 14, 2005, Mar. 25, 2008.

Non-Final Office Action, United States Patent & Trademark Office, U.S. Appl. No. 10/944,320, filed Sep. 17, 2004, Apr. 8, 2008.

Microprocessor and Microcomputer Standards Subcommittee of the IEEE Computer Society, "Draft Standard for a High-Speed Memory Interface (SyncLink)," Draft 0.99 IEEE P1596.7-199X, pp. 1-66 (1996).

Yoo, Hoi-Jun, et al., "A 150 MHZ 8-Bank 256M Synchronous DRAM with Wave Pipelining Methods," IEEE ISSCC, Digest of Technical Papers, p. 250-251, 374, Feb. 17, 1995.

Gillingham, Peter, "SLDRAM Architectural and Functional Overview," SLDRAM Consortium, SLDRAM Inc., pp. 1-14 (Aug. 29, 1997).

Ware, Frederick A., "RDRAM Design Guide", Rambus Inc. Apr. 20, 1995, pp. 1-114.

The Institute of Electrical and Electronics Engineering, Inc., "IEEE Standard for High-Bandwidth Memory Interface Based on Scalable Coherent Interface SCI Signaling Technology (RamLink)," 1996, pp. 1-99.

Kushiyama, Natsuki et al, "A 500-Megabyte/s Data-Rate 4.5M DRAM" IEEE Journal of Solid State Circuits, IEEE Service Center, Piscataway, NJ, US, vol. 28, No. 4, Apr. 1, 1993 (Apr. 1, 1993), pp. 490-498, XP000362979 ISSN: 0018-9200.

Sakei, Takanori, et al., "SP 23.4: A 2.5 ns Clock Acess 250MHz 256Mb SDRAM with a Synchronous Mirror Delay," IEEE ISSCC Digest of Technical Papers, pp. 374-375, 476, Feb. 10, 1996.

Atwood, John "p5 18M RDRAM Test Modes", Rambus Inc. Draft of Aug. 3, 1992, pp. 1-14.

Atwood, J., "NEC 18Mb Rambus DRAM Core Interface," Draft of Aug. 9, 1992.

SLDRAM Consortium, "400 Mb/s/pin SLDRAM Draft/Advance Data Sheet," (pp. 1-56), Aug. 27, 1997.

Rambus Inc., "16/18Mbit (2Mx8/9) & 64/72 Mbit (8Mx8/9) Concurrent RDRAM - Advance Information," Rambus Inc. Data Sheet, Jul. 1996, 61 pages.

Choi, Yunho, et al., "16Mbit Synchronous DRAM with 125Mbyte/sec Data Rate", 1993 Symposium on VLSI Circuits, Digest of Technical Papers, pp. 65-66, 1993.

"Rambus Interface Technical Description-Version 4.2," Draft of Aug. 19, 1992, Rambus Inc., pp. 177-207.

Han, Jin-Man et al., "Skew Minimization Techniques for 256M-bit Synchronous DRAM and beyond", IEEE Solid State Circuits Council Symposium on VLSI Circuits, Jun. 13-15, 1996 (2 pages).

Rambus Inc. Rambus Interface Technical Description, Version 4.2 - Preliminary, Jan. 20, 1992, pp. 1-208.

MOSYS, Inc., "MD904 to MD920, 1/2 to 2 1/2 MByte Multibank DRAM (MDRAM) 128Kx32 to 656x32," Preliminary Information, Feb. 21, 1997.

Bursky, Dave, "Memory-CPU Interface Speeds Up Data Transfers," Electronic Design, Mar. 19, 1992, pp. 137-142.

Kodama, Yukimori et al. "A 150-MHz 4-Bank 64M-bit SDRAM with Address Incrementing Pipeline Scheme," 1994 Symposium on VLSI Circuits Digest of Technical Papers, 1994.

Kushiyama, N. et al., "500Mbyte/sec Data-Rate 512 Kbits x 9 DRAM Using a Novel I/O Interface," 1992 Symposium on VLSI Circuits Digest of Technical Papers, 1992.

MOSAID Technologies, "SyncLink Feasibility v1.1," Synclink Consortium, Apr. 30, 1996.

Notice of Allowance and Fee(s) Due, United States Patent & Trademark Office, U.S. Appl. No. 11/151,791 filed Jun. 14, 2005, Dec. 15, 2008.

Response to Non-Final Office Action, U.S. Appl. No. 10/944,320 filed Sep. 17, 2004, Jan. 21, 2009.

Notice of Allowance and Fee(s) Due dated Apr. 3, 2009, United States Patent & Trademark Office, U.S. Appl. No. 10/944,320 filed Sep. 17, 2004.

Non-Final Office Action dated Apr. 21, 2009, United States Patent & Trademark Office, U.S. Appl. No. 10/993,046 filed Nov. 19, 2004.

* cited by examiner

SYSTEM AND MODULE INCLUDING A MEMORY DEVICE HAVING A POWER DOWN MODE

This application is a continuation of U.S. patent application Ser. No. 11/030,231 filed on Jan. 6, 2005 now abandoned, which is a continuation of U.S. patent application Ser. No. 10/993,046 filed on Nov. 19, 2004, which is a continuation of U.S. patent application Ser. No. 09/685,014 filed on Oct. 5, 2000 (U.S. Pat. No. 6,842,864), which is a continuation of U.S. patent application Ser. No. 09/038,358 filed on Mar. 10, 1998 (U.S. Pat. No. 6,154,821).

FIELD OF THE INVENTION

The present invention relates generally to the control of dynamic random access memory (DRAM) devices. More particularly, the present invention relates to the initialization and configuration of DRAM devices.

BACKGROUND OF THE INVENTION

Improvements in microprocessor designs have led to microprocessors with a high operating frequency. Current microprocessor designs may exceed operating frequencies of 200 megahertz (MHz). However, the increase in operating frequency typically has not led to fully acceptable performance gains. One of the main components affecting performance gains is created by the microprocessor execution units idling during delays in external memory access. The delays in external memory access are caused by the conventional design characteristics of static random access memory (SRAM) cells, read only memory (ROM) cells, and dynamic random access memory (DRAM) cells.

To counteract the performance losses associated with external memory access, Rambus Inc., of Mountain View, Calif. developed a high speed multiplexed bus. FIG. 1 is a typical prior art system using the Rambus high speed bus. In particular, the system 1000 comprises a master device, or central processing unit (CPU) 10, coupled to slave devices DRAM 20, SRAM 30, and ROM 40. Each device is coupled in parallel to signal lines comprising DATA BUS, ADDR BUS, CLOCK, $V_{REF}$, GND, and VDD. The DATA BUS and ADDR BUS signal lines comprise the data and address lines, respectively, used by CPU 10 to access data from the slave devices. The CLOCK, $V_{REF}$, GND, and VDD signal lines comprise the clock, voltage reference, ground, and power signals, respectively, shared between the multiple devices. Data is transferred by bus drivers (not shown) of each device driving signals onto the bus. The signals are transmitted across the bus to a destination device.

To increase the speed of external memory accesses, the system 1000 supports large data block transfers between the input/output (I/O) pins of CPU 10 and a slave device. The system 1000 also includes design requirements that constrain the length of the transmission bus, the pitch between the bus lines, and the capacitive loading on the bus lines. Using these design requirements the system 1000 operates at a higher data transfer rate than conventional systems. Accordingly, by increasing the data transfer rate, the system 100 reduces the idle time in CPU 10.

The system 1000, however, does not provide enough bus bandwidth for developing technologies. New technologies require data transfer rates greater than 500 megabits per second (Mb/s) per pin. Alternatively, new technologies require operation speeds of at least several hundred MHz. Operating at high frequencies accentuates the impact of process-voltage-temperature (PVT) on signal timings and signal levels. The PVT variances result in numerous disadvantages that create high transmission errors, or data loss, when operating the system 100 at a frequency of 400 MHz, for example.

A factor to be considered in high-speed bus operations is the precise control and timing of the memory devices coupled to the bus. When the memory system is operated at low frequencies, communications between the memory controller and all of the memory devices on the bus are generally completed within the period of one clock cycle. However, one disadvantage associated with operating the typical prior art memory system at a high frequency such as 400 MHz is that the system bus propagation delay between the memory controller and some memory devices is longer than one clock cycle. This results in communications between the memory controller and some memory devices taking longer than the period of one clock cycle to complete.

One method for dealing with this timing problem is to have the memory controller track the propagation delay times associated with each memory device so as to effectively manage the communications between each device and the memory controller. This technique, however, heavily tasks the memory controller and memory assets, thereby increasing the system memory requirements and introducing additional sources of delay due to the additional processing requirements. A significant cost increase can result from the use of this technique.

Numerous timing parameters are specified in multiple configuration registers of the memory devices. Taken together, these timing parameters typically specify communications between the memory controller and any number of memory devices. A problem with these prior art systems, however, is that the register fields of the typical memory devices are preprogrammed with reset values that are supposed to guarantee functionality at the fastest specified dock rate of a particular device. However, optimal performance can only be achieved when some of the parameters are adjusted from their preset values. These adjustments are performed by the memory controller using register write requests; however, it has proven problematic for the prior art memory controller to determine values at which these delays are set or to know values at which these delays are to be set. Typically, the only way for a memory controller to determine the reset value or to establish the optimum value is to query some form of device manufacturer register of the memory controller or the memory device for the vendor and memory identification, thereby allowing the memory controller to index through a look-up table of known optimal values. Unfortunately, this method does not allow for adjustments to compensate for process variations. Moreover, this method does not allow for dynamic adjustments to register values. Furthermore, this method fails for any memory devices introduced after the memory control Basic Input/Output System was set.

Another disadvantage in operating typical prior art memory systems at high frequencies is that correct functionality is guaranteed only when devices having the correct speed device are placed on the channel. However, with the introduction of memory devices having a variety of speed grades, correct functionality is no longer guaranteed as there is no way for the prior art memory controller to detect that a slow part is placed on a fast channel. The device may work most of the time, but fail under extreme operating or environmental conditions. This is a problem that has plagued the computer industry since the first memory devices were binned according to access time. Thus, as the memory device configuration registers determine so much of the behavior of the memory device, the memory device initialization procedure is a vital element of the overall controller-memory interface.

Typical prior art memory systems take advantage of low power modes during processor lulls in order to reduce the overall system power consumption. These low power modes are modes in which memory components or devices may be placed in lower frequency modes during periods of inactivity or reduced activity. Another disadvantage of these prior art memory systems is that a substantial delay in processing times may be incurred in waiting for these components to return to the higher frequency mode.

SUMMARY AND OBJECTS OF THE INVENTION

It is therefore an object of the invention to provide memory device initialization that includes levelizing of the system bus or channel, wherein levelizing comprises configuring each of the memory devices coupled to the bus to respond to read commands from the corresponding memory controller within a same number of clock cycles.

It is a further object of the invention to determine a minimum clock cycle offset between a read command and a subsequent write command communicated to memory devices on a bus.

It is a further object of the invention to determine a minimum clock cycle offset between a write command and a subsequent read command communicated to memory devices on a bus.

It is a further object of the invention to configure a power-down exit register for use in bus clock acquisition upon returning a memory device to operation from a low-power state.

These and other objects of the invention are provided by a channel initialization that levelizes the channel. In one embodiment, the levelizing comprises determining the response time of each of a number of DRAM devices coupled to a bus. Determining the response time for a DRAM device comprises writing logic ones to a memory location of the DRAM device using the bus. Subsequently, a read command is issued over the bus, wherein the read command is addressed to the newly-written memory location of the DRAM device. The memory controller then measures the elapsed time between the issuance of the read command and the receipt of the logic ones from the DRAM device, and this elapsed time is the response time of the DRAM device. The process is repeated for each DRAM device coupled to the bus and the memory controller.

Following the determination of a response time for each DRAM device, and using the longest response time, a delay is computed for each of the DRAM devices coupled to the bus so that the response time, in clock cycles, of each of the DRAM devices coupled to the bus equals the longest response time. A delay is programmed in at least one register of each of the DRAM devices coupled to the bus by writing values to at least one register of each of the DRAM devices.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

A method and apparatus-for initializing dynamic random access memory (DRAM) devices is provided wherein a channel is levelized by determining the response time of each of a number of DRAM devices coupled to a bus. Determining the response time for a DRAM device comprises writing logic ones to a memory location of the DRAM device using the bus. Subsequently, a read command is issued over the bus, wherein the read command is addressed to the newly-written memory location of the DRAM device. The memory controller then measures the elapsed time between the issuance of the read command and the receipt of the logic ones from the DRAM device, and this elapsed time is the response time of the DRAM device. Following the determination of a response time for each DRAM device, and using the longest response time, a delay is computed for each of the DRAM devices coupled to the bus so that the response time, in clock cycles, of each of the DRAM devices coupled to the bus equals the longest response time. A delay is programmed in at least one register of each of the DRAM devices coupled to the bus by writing values to at least one register of each of the DRAM devices.

Figure 1:
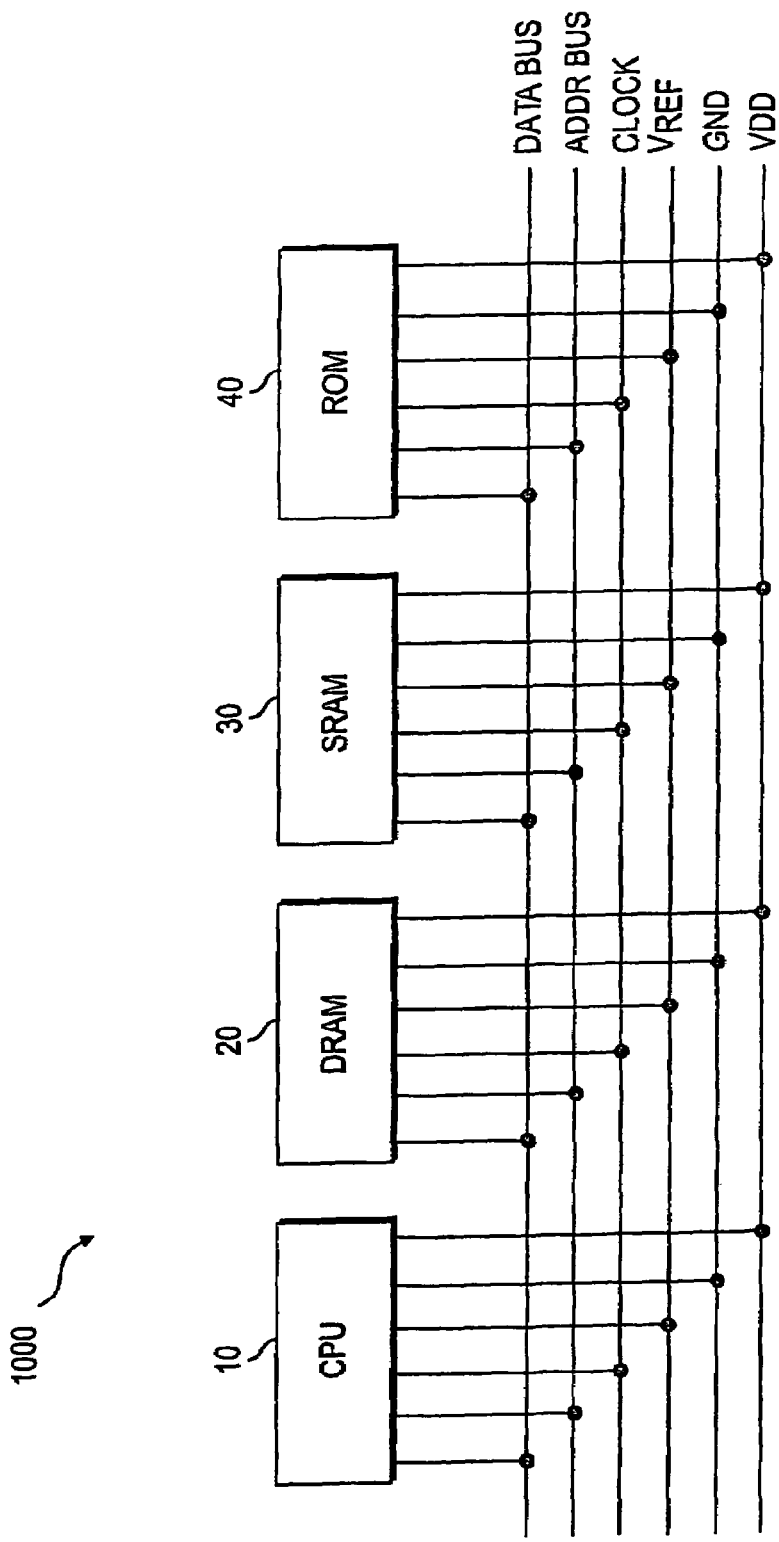
FIG. 1 is a typical prior art system using the Rambus high speed bus.
Figure 2:
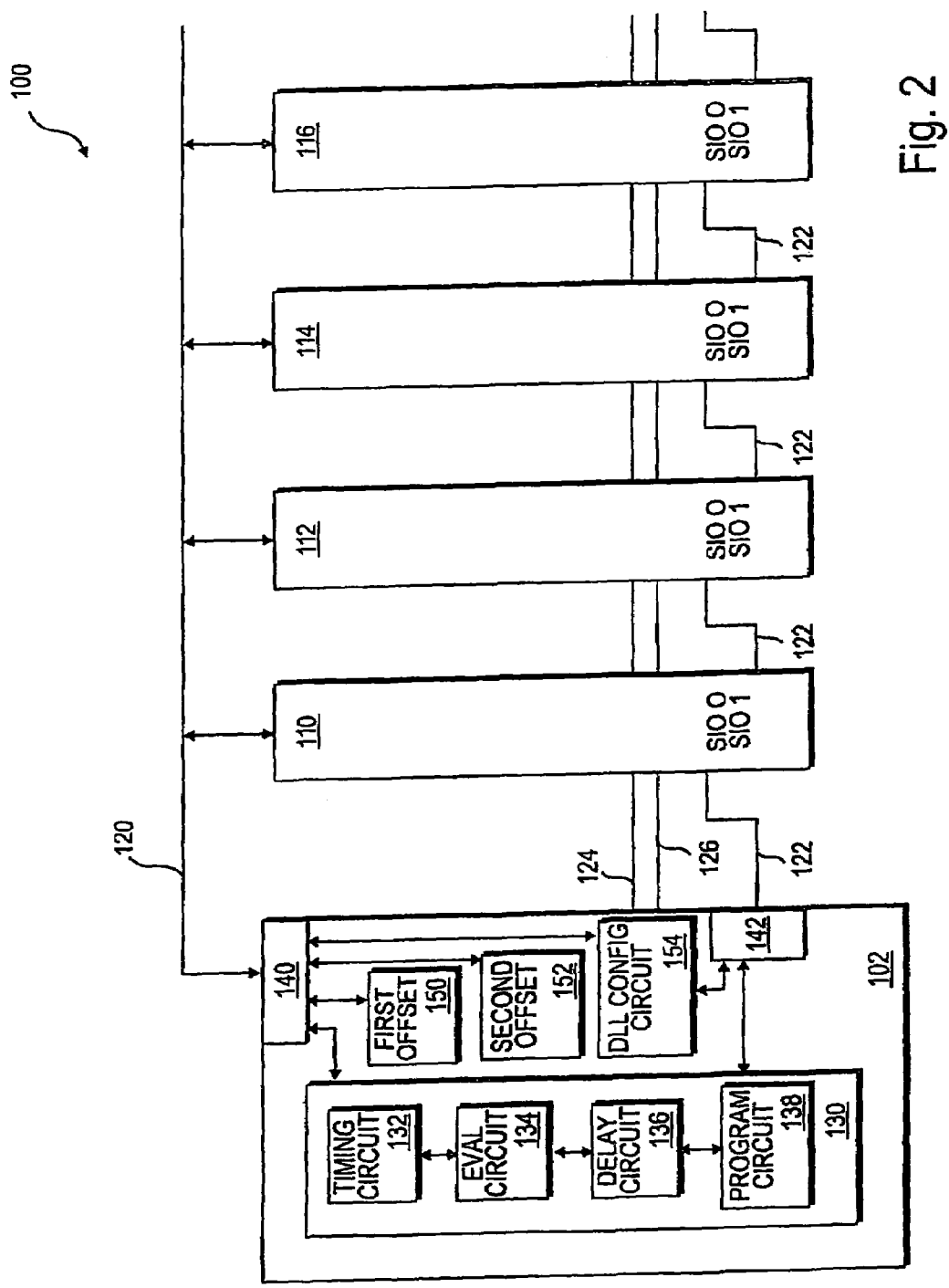
FIG. 2 is a block diagram of a memory system comprising dynamic random access memory (DRAM) devices in one embodiment.

FIG. 2 is a block diagram of a memory system 100 comprising DRAM devices in one embodiment. A memory controller 102 is coupled to four DRAM devices 110-116 using two different sets of connections 120 and 122, but the embodiment is not so limited. One set of connections forms a bus 120 or channel over which information is passed between the memory controller 102 and all DRAM devices 110-116. Another set of connections forms an auxiliary channel 122 over which an SIO signal is communicated. In one embodiment, this low-speed serial chain 122 loops through all DRAM devices 110-116 on the channel using the complementary metal-oxide semiconductor (CMOS) input and output pins SIO0 and SIO1, but the embodiment is not so limited. The auxiliary channel 122, while being used to initialize the DRAM devices 110-116 and control DRAM device register values, makes it possible to restrict the DRAM devices that receive information passed along the auxiliary channel 122.

The memory controller 102 of one embodiment comprises a levelizing circuit 130, a first offset circuit 150, a second offset circuit 152, and a delay lock loop (DLL) configuration circuit 154 coupled to the main channel 120 through a main channel interface 140. The levelizing circuit 130 and the DLL configuration circuit 154 are coupled to the auxiliary channel through the auxiliary channel interface 142.

The levelizing circuit 130 comprises a timing circuit 132, an evaluation circuit 134, a delay circuit 136, and a programming circuit 138. In operation, as discussed herein, the levelizing circuit 130 levelizes a read domain of the DRAM devices 110-116 by configuring each of the DRAM devices 110-116 to respond to read commands from the memory controller 102 in the same amount of time, but the embodiment is not so limited. The timing circuit 132 is configured to determine the response time of each of the DRAM devices 110-116 using information communicated over the main channel 120. The evaluation circuit 134 is configured to determine the longest response time of the response times determined by the timing circuit 132. The delay circuit 136 is configured to compute a delay for each of the DRAM devices 110-116 so that the response time of each of the DRAM devices 110-116 equals the longest response time. The programming circuit 138 is configured to program the delay in each of the DRAM devices 110-116 by writing values to at least one register of each of the DRAM devices 110-116 using the auxiliary channel.

The first offset circuit 150 is configured to determine a minimum clock cycle offset between a read command and a subsequent write command communicated to the DRAM devices 110-116 over the main channel 120. The second offset circuit 152 is configured to determine a minimum clock cycle offset between a write command and a subsequent read command communicated to the DRAM devices 110-116 over the main channel 120. The DLL configuration circuit 154 is configured to configure at least one power-down exit register in the DRAM devices 110-116 for DLL acquisition.

The various components of the memory controller 102 may be hosted in hardware, firmware, software, or some combination of hardware, firmware, and software, but the embodiment is not so limited. In one embodiment, the memory controller 102 may use a digital processor using algorithms and data stored in memory devices to implement the functions of the levelizing circuit 130, the first offset circuit 150, the second offset circuit 152, the DLL configuration circuit 154, and the components thereof, but the embodiment is not so limited.

Two additional signals 124 and 126 are used in conjunction with the SIO signal from the memory controller. The first additional signal is the CMD signal 124 which indicates a new SIO operation is being transmitted on the auxiliary channel. As the CMD signal indicates that a new SIO operation is being transmitted, the CMD signal is said to frame SIO operations. The second additional signal is the SCK signal 126, which is the clock signal transmitted with the data on the auxiliary channel and the CMD signal.

As previously discussed, each DRAM device has two CMOS input pins SIO0 (with reference to FIGS. 4A and 4B, SIN) and CLIN and two CMOS output pins SIO1 (with reference to FIGS 4A and 4B, SOUT) and CLOUT. These pins provide serial access to a set of control registers in each DRAM device. These control registers provide configuration information to the controller during the initialization process, and allow an application to select the appropriate operating mode of the DRAM device. The CLIN is a free-running CMOS clock driven by the controller to the first DRAM device. The SIN is a CMOS serial input. Both inputs are low-true, so the high signal voltage is a logic zero. In normal operation, the two inputs are repeated on the CLOUT and SOUT outputs, which connect to the inputs of the next DRAM device on the bus. Write and read transactions are each composed of four packets, wherein each packet comprises 32 bits.

In operation, the DRAM devices 110-116 are first configured and then put into service. In one embodiment, the process of configuring the DRAM devices 110-116 comprises initialization operations. The initialization operations comprise setting register values used to control the timing of operations that write data to and read data from the DRAM devices 110-116. The initialization operations are performed over the auxiliary channel 122, while the operations comprising writing data to and reading data from the DRAM devices are performed over the bus 120. Therefore, initialization commands may be carried using the SIO pins of each DRAM device 110-116, while commands for data to be written to and read from each DRAM device 110-116 are carried over the main channel connections of the DRAM devices 110-116. In one embodiment, the main channel connections comprise RSL pins, but the embodiment is not so limited.

Furthermore, the auxiliary channel 122 and the SIO pins are capable of being used to dynamically configure at least one register in the DRAM devices during memory access operations over the bus. The main channel connections that couple the DRAM devices 110-116 to the bus 120 are logically separated into two groups, one for transmitting a class of commands called Primary Control Packets (PCPs), and one for transmitting a class of commands called Secondary Control packets (SCPs). The PCPs are used to communicate Row Address (RAS) commands that perform the first half of a memory access, but the embodiment is not so limited. The SCPs are used to communicate Column Address (CAS) commands that perform the second half of a memory access, but the embodiment is not so limited.

Each DRAM device has an input and an output data pin SIO0 and SIO1 over which the initialization information is passed. A configurable register, or SIO repeater register, in each DRAM device allows information presented on the SIO0 pin of a DRAM device to be placed or repeated on the SIO1 pin of the DRAM device so that information can be propagated to DRAM devices that are further down the serial chain. The DRAM devices have two unique identifiers: one identifier is used for SIO, or initialization, operations and is hence associated with the auxiliary channel over which initialization commands are communicated to the DRAM device; and, one identifier is used for bus operations and is hence associated with the bus over which read and write operations are performed. When an SIO operation is performed, the operation has an associated SIO identification (ID). When the repeater register is set appropriately, the SIO operations are propagated down the SIO serial chain to all devices on the serial chain, wherein the device having an SIO ID matching that of the SIO operation takes appropriate action. When a bus operation is performed, the operation has an associated memory address or ID that is used the particular DRAM device; therefore, in one embodiment, there is one DRAM device ID used per bus for each of two buses, but the embodiment is not so limited.

In the case where an SIO register read is performed in which the memory controller wishes to read the value in a DRAM device register, the value of the register must be passed back to the memory controller. As the SIO serial chain of one embodiment does not wrap back around from the last DRAM device in the serial chain to the memory controller, this data must be passed back by reversing the directionality of the SIO0 and SIO1 pins of each device. Therefore, when passing data back to the memory controller from a DRAM device using the auxiliary channel of one embodiment, SIO1 becomes an input pin and SIO0 becomes an output pin.

In application, DRAM devices can be grouped together onto in-line memory modules. There is no set number of devices that must be on a module, subject to the maximum number of devices allowed on the channel. In this application, each in-line memory module may contain a special area of storage that allows for a process known as Serial Presence Detect (SPD). Serial Presence Detect information includes the number of DRAM devices on the module, as well as some of the timing and architectural characteristics of the DRAM devices on the module. During the process of initialization, the memory controller must read SPD information, if available, in order to decide how best to handle and process memory requests. However, SPD information is accessed through a different set of wires in one embodiment, so it is not accessed using the main channel connections or the auxiliary channel, but the embodiment is not so limited.

In one embodiment, the DRAM devices may be configured to operate at two different frequencies during operation while the initialization operations are conducted at a different frequency. Therefore, the initialization operations are performed at a frequency approximately equal to 1 megahertz (MHz) using a first protocol, while the memory access operations may be performed at a frequency approximately equal to either 400 MHz or 50 MHz using a second protocol, but the embodiment is not so limited. While the DRAM devices of a system are operating at the same frequency, a transition may be made to move the DRAM devices between a faster and a slower frequency. The clock that drives operations at the faster frequency is called the fast clock, and the clock that drives operation at the slower frequency is called the slow clock. When operating using the fast clock, a different set of registers may be used by the DRAM devices for some types of operations than when the DRAM devices are operating using the slow clock.

Figure 3:
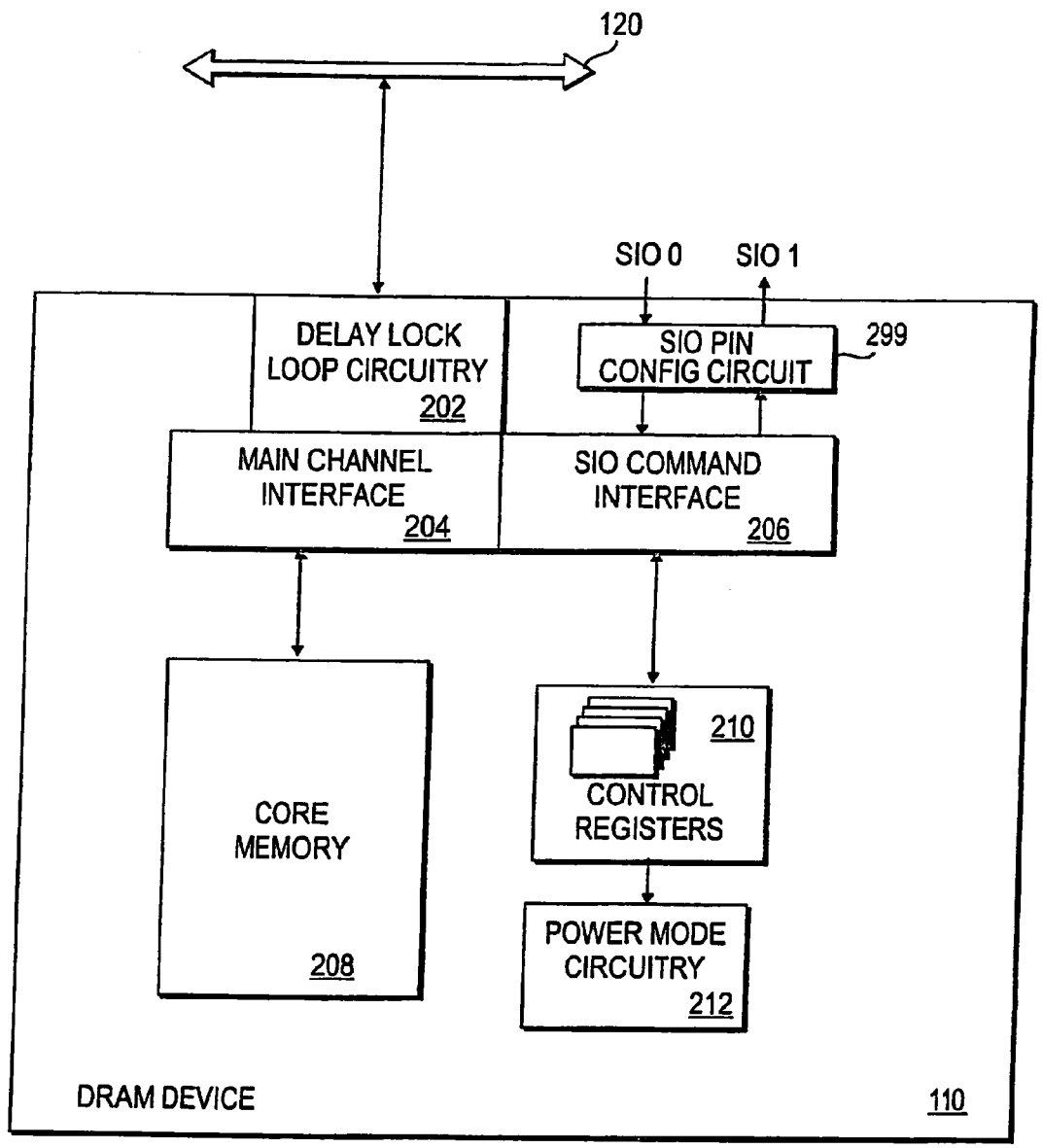
FIG. 3 is a block diagram of a DRAM device of one embodiment.

FIG. 3 is a block diagram of a DRAM device 110 of one embodiment. The DRAM device comprises, but is not limited to, delay lock loop (DLL) circuitry, an interface 204 and 206, control registers 210, power mode circuitry 212, and core memory 208. The interface 204 and 206 comprises a main channel interface 204 and a SIO command interface 206. The main channel interface 204 couples the DRAM device 110 to the bus 120 and passes information between the core memory 208 of the DRAM device 110 and the bus 120. The SIO command interface is coupled to the SIO0 and SIO1 pins of the DRAM device and couples the DRAM device to the auxiliary channel over which the SIO signals are passed. The SIO command interface 206 is coupled to communicate information to and from the control registers 210 of the DRAM device 110. The control registers 210 are coupled to provide register information to the power mode circuitry 212. The DLL circuitry senses and tracks the edges of the high-speed bus clock signals and, in accordance therewith, determines the optimal placement of information from the DRAM device memory core on the bus 120. The bus clock may operate at a speed of 400 megahertz (MHz) or a speed of 50 MHz, but the embodiment is not so limited.

The DRAM devices of one embodiment may operate in one or more low power modes in order to reduce the power consumption of the memory device. When the DRAM devices transition from a low-power mode to a full-power mode, there may be a period of time in which the DRAM devices should not be read from or written to because the device is not electrically ready to accept such transactions. To reduce the latency associated with the transition period, the DLL circuit uses two sets of biasing information, coarse and fine, so as to provide for limited functionality of the DRAM devices during the transition period. During a first period of time immediately following a start of the transition out of a low-power mode, the coarse biasing information is used to allow the DLL to provide limited acquisition of the bus clock signal. Following this first period of time, when the full-power mode is reached, the fine biasing information is used to allow the DLL to fully synchronize with the bus clock signal.

Initialization of the DRAM devices comprises configuring at least one power-down exit register of each DRAM device for use in delay lock loop (DLL) acquisition. This configuration is performed using the SIO signal communicated over the auxiliary channel coupled among the DRAM devices. Configuration of the power-down exit registers comprises storing a set of coarse biasing information of the DLL in a first register of the corresponding DRAM device and storing a set of fine biasing information of the DLL in a second register of the corresponding DRAM device. The DLL uses the biasing information from the first and the second registers, upon recovery from a low-power mode, to re-establish synchronization with the bus clock signal or pulse.

Figure 4A:
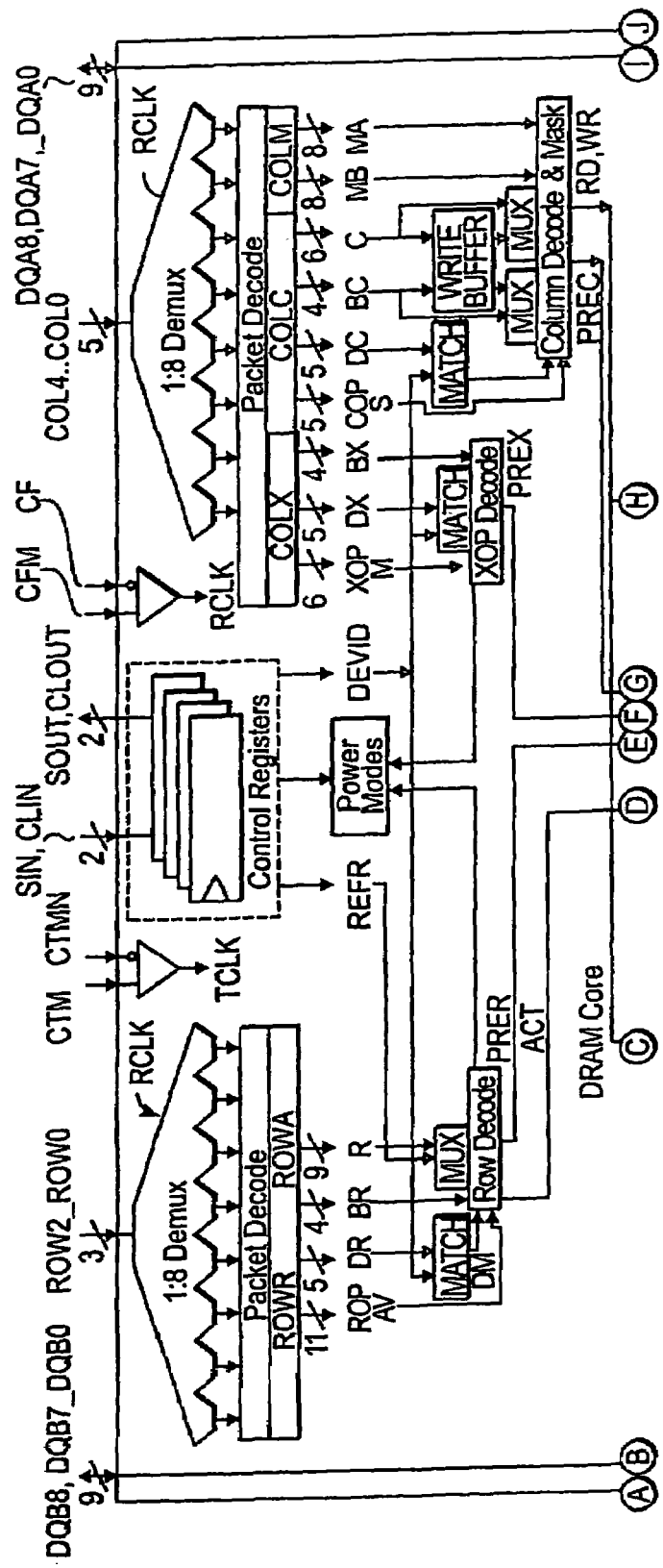
FIGS. 4A and 4B are a block diagram of a 64/72-Mbit DRAM device of one embodiment.
Figure 4B:
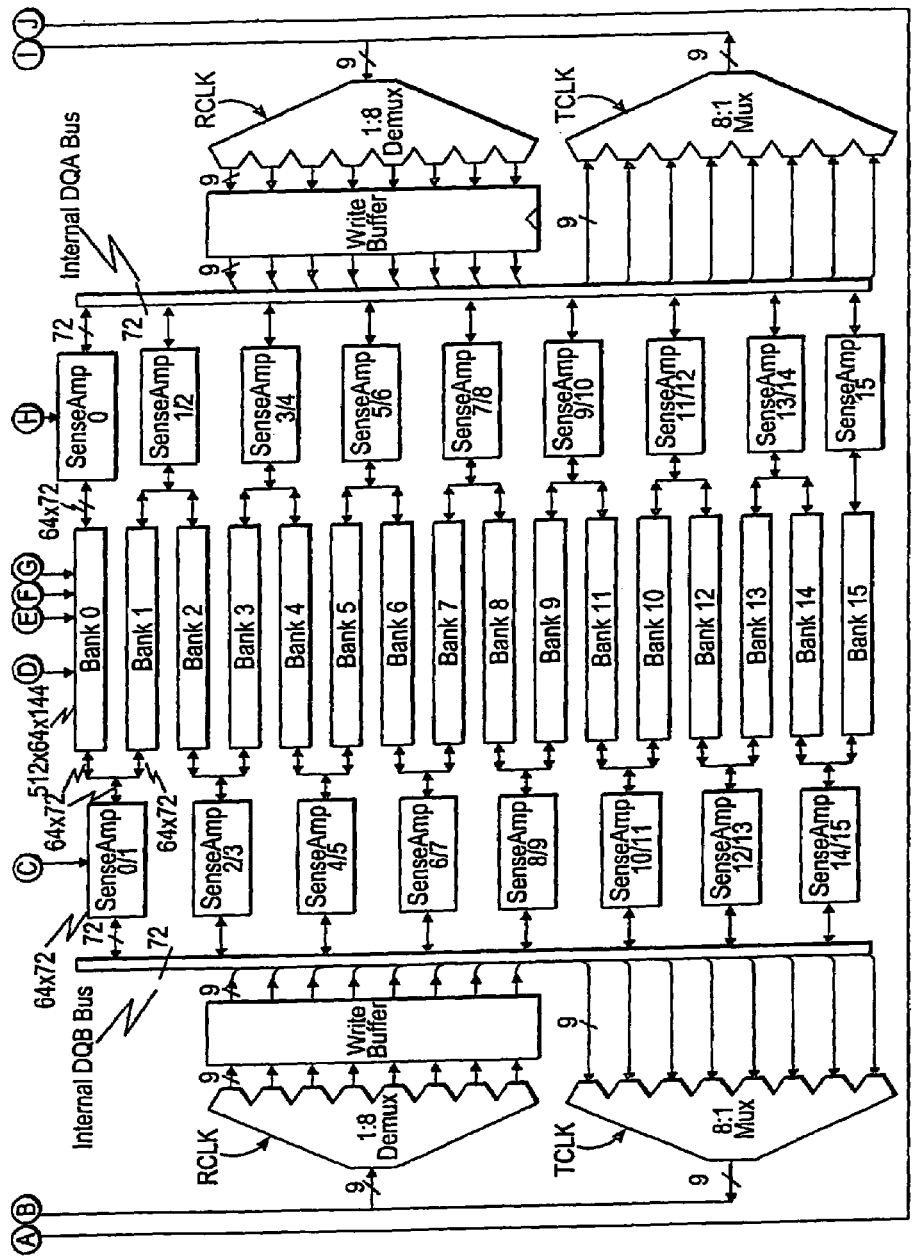

FIGS. 4A and 4B are a block diagram of a 64/72-Mbit DRAM device of one embodiment. This DRAM device comprises two major blocks: a core block comprising banks and sense amps similar to those found in other types of DRAM, and an interface block which permits an external controller to access this core at up to 1.6 gigabytes per second. The 8 Mbyte core memory of the DRAM device is divided into sixteen 0.5 Mbyte banks, each organized as 512 rows, with each row comprising 64 dualocts, and each dualoct containing 16 bytes. A dualoct is the smallest unit of data typically addressed in this DRAM device, but the embodiment is not so limited. In one embodiment, each DRAM device contains 17 sense amp arrays, but the embodiment is not so limited. Each sense amp consists of 512 bytes of fast storage and can hold one-half of one row of one bank of the DRAM device. The sense amp may hold any of the 512 half-rows of an associated bank. A 3-pin row-access-control bus (ROW) is used to manage the transfer of data between the banks and the sense amps of the DRAM device. These pins are de-multiplexed into a 24-bit ROWA (row-activate) or ROWR (row-operation) instruction.

The SIO0 or SIN, SIO1 or SOUT, CLIN, and CLOUT pins are used to write and read a block of control registers. These registers supply the DRAM device configuration information to the memory controller and they select the operating modes of the device. The 9-bit REFR value is used for tracking the last refreshed row. Most importantly, the 5-bit DEVID specifies the device address of the DRAM device on the channel.

The clock-to-master (CTM and CTMN) signals become the transmit clock (TCLK) which is the internal clock used to transmit read data. The clock-from-master (CFM and CFMN)

signals become the receive clock (RCLK) which is the internal clock signal used to receive write data and to receive the ROW and COL buses.

These two 9-bit buses carry read and write data across the main channel. They are multiplexed/de-multiplexed from/to two 72-bit buses running at one-eighth the data frequency inside the DRAM device. A 5-pin column-access-control bus (COL) is to manage the transfer of data between the DQA/DQB buses and the sense amps of the DRAM device.

Figure 5:
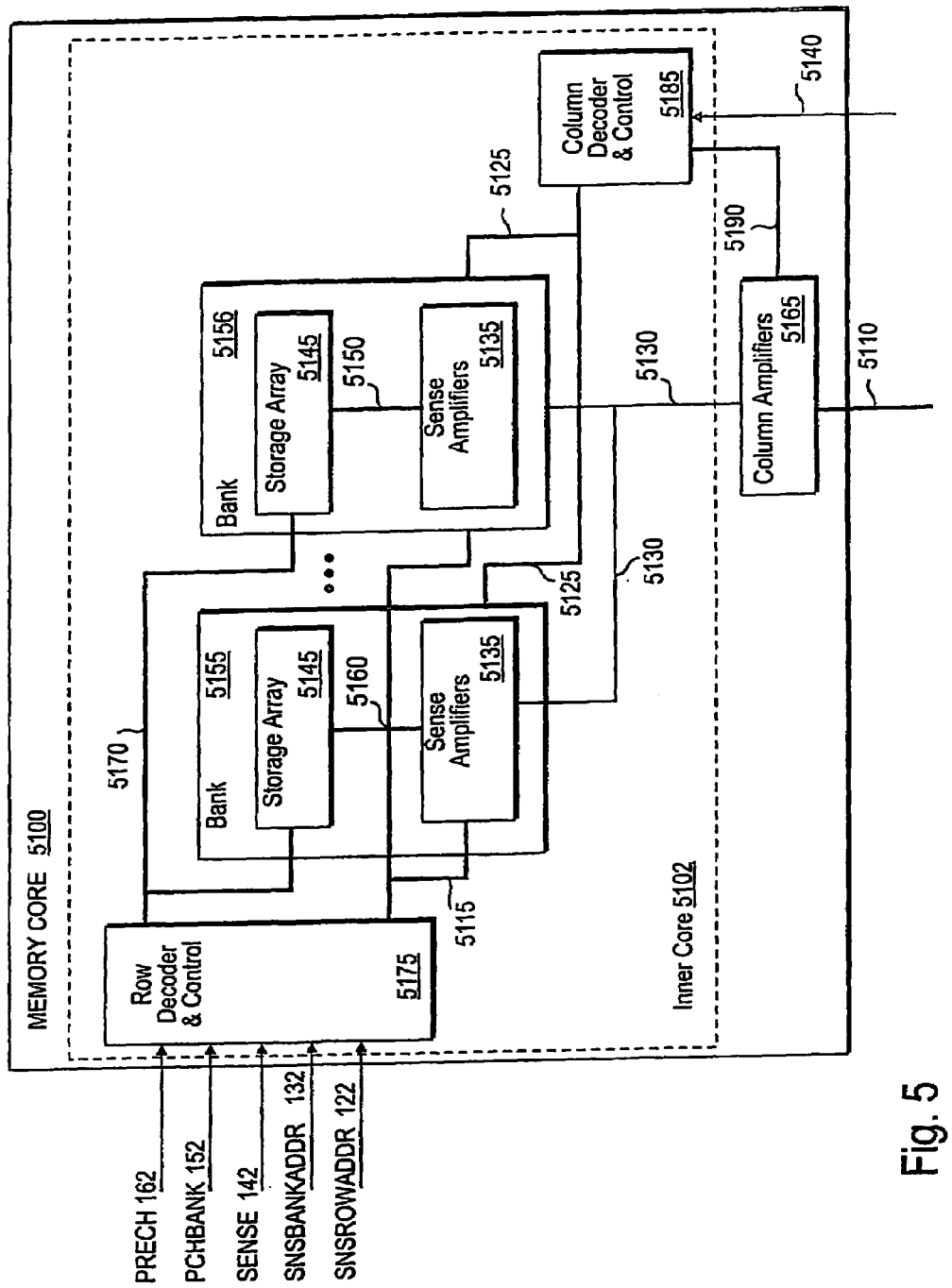
FIG. 5 is a memory core of one embodiment.
Figure 6:
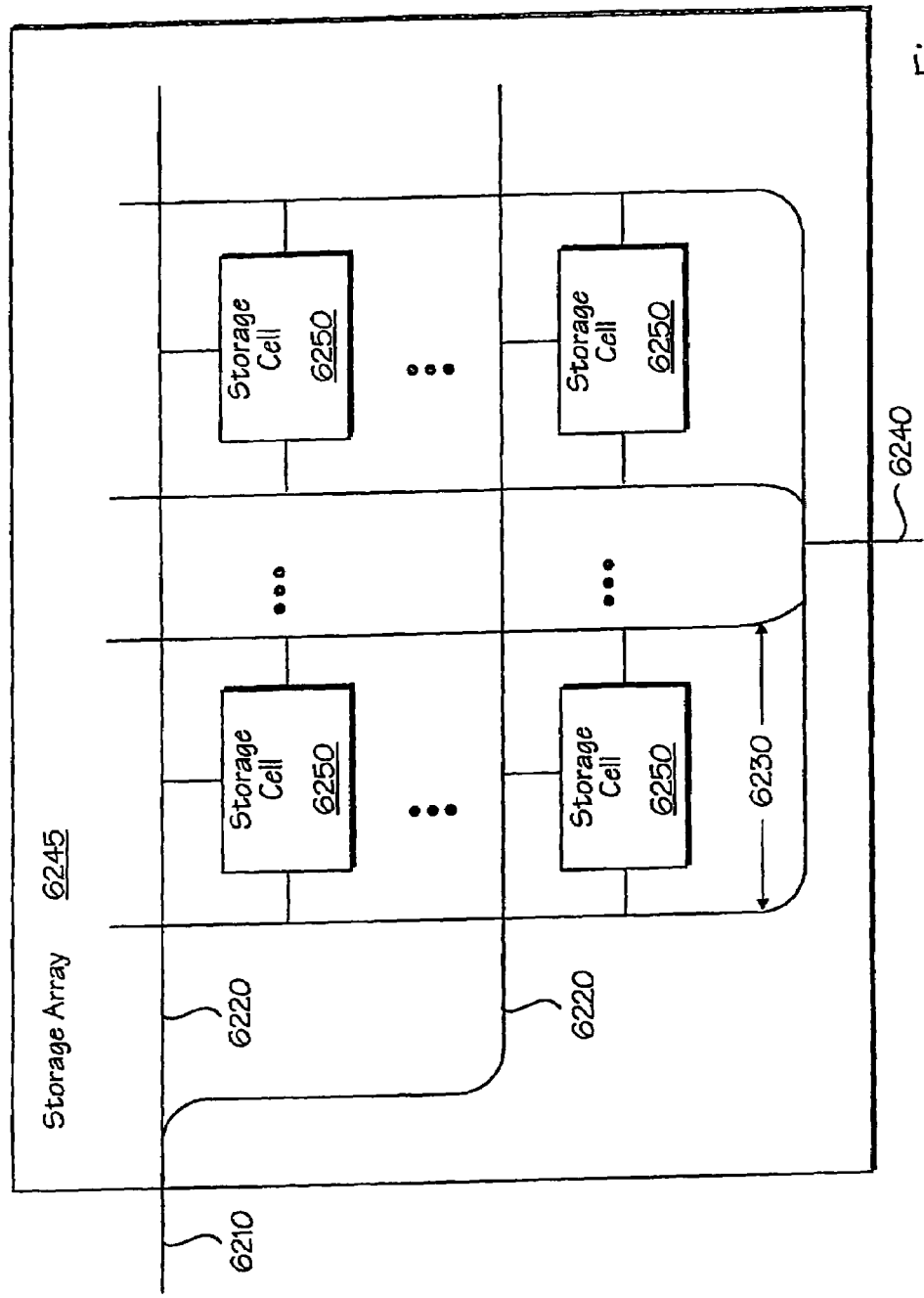
FIG. 6 is the arrangement of the storage cells in the storage array of one embodiment.

FIG. 5 is a memory core of one embodiment. FIG. 6 is the arrangement of the storage cells 6150 in the storage array 6245 of one embodiment. Storage array 5145, comprising the actual storage cells 6250, is shown with various other circuit blocks necessary to store and retrieve data from the storage array 5145, but the embodiment is not so limited. Support circuitry comprises a row decoder and control block 5175, a column decoder and control block 5185, sense amplifiers 5135, and column amplifiers 5165. The row decoder and control 5175 receives row control and address signals PRECH 5162, PCHBANK 5152, SENSE 5142, SNSBANKADDR 5132, and SNSROWADDR 5122. The row decoder and control 5175 drives wordline signals 5170 into the storage array 5145 and drives row control signals 5115 into the sense amplifiers 5135. The column decoder 5185 receives the column address and control signals 5140. The column decoder 5185 drives the column select lines 5125 to the sense amplifiers 5135 and drives the column control signals 5190 to the column amplifiers 5165. Sense amplifiers 5135 receive the column select lines 5125, the row control signals 5115, and the array data 5160 and 5150 from the storage array 5145. Column amplifiers 5165 receive the sense amplifier data 5130 and the column control signals 5190 and drive the sensed data 5110 to circuits outside the memory core or data to be written into the sense amplifiers 5135.

Lines 6210 entering the storage array 6245 correspond to lines 5170 in the memory core 5100 and are the wordlines 6220 used for selecting a row of storage cells. Lines 6240 correspond to lines 5160 in the memory core 5100 and are the bit lines used for receiving data from one of the columns 6230 of a selected row of cells.

Figure 7:
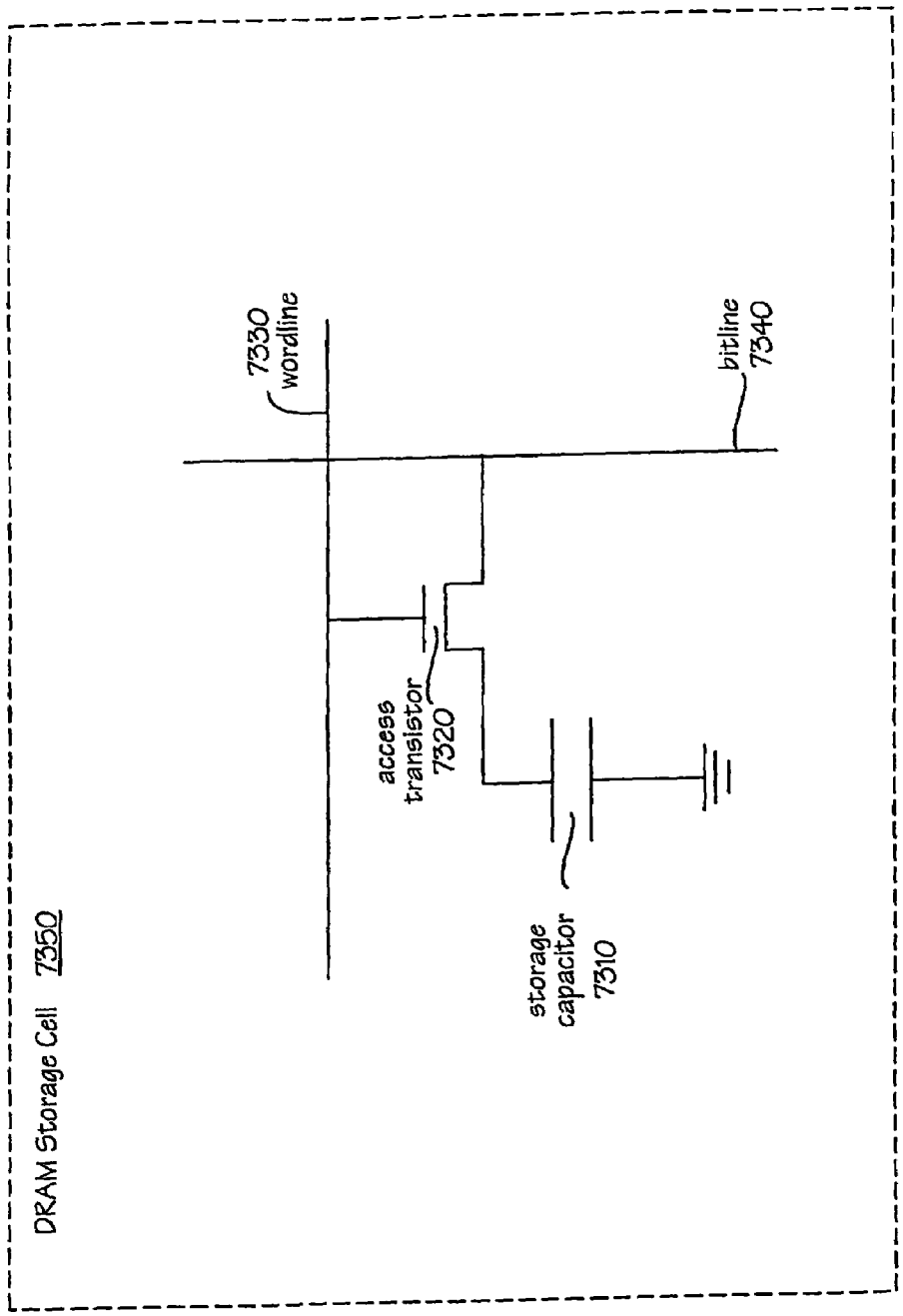
FIG. 7 is a DRAM storage cell of one embodiment.

FIG. 7 is a DRAM storage cell 7350 of one embodiment. The DRAM storage cell 7350 comprises an access transistor 7320 coupled to the wordline 7330 and a storage capacitor 7310 on which data is stored as charge. The charge on the storage capacitor 7310 is coupled through the access transistor 7320 to the bitline 7340 when the wordline 7330 is activated. When access transistor 7320 couples the stored charge to the bit line, the charge on the storage capacitor 7310 is reduced; the charge on the storage capacitor 7310 should be restored if data is not to be lost.

Figure 8:
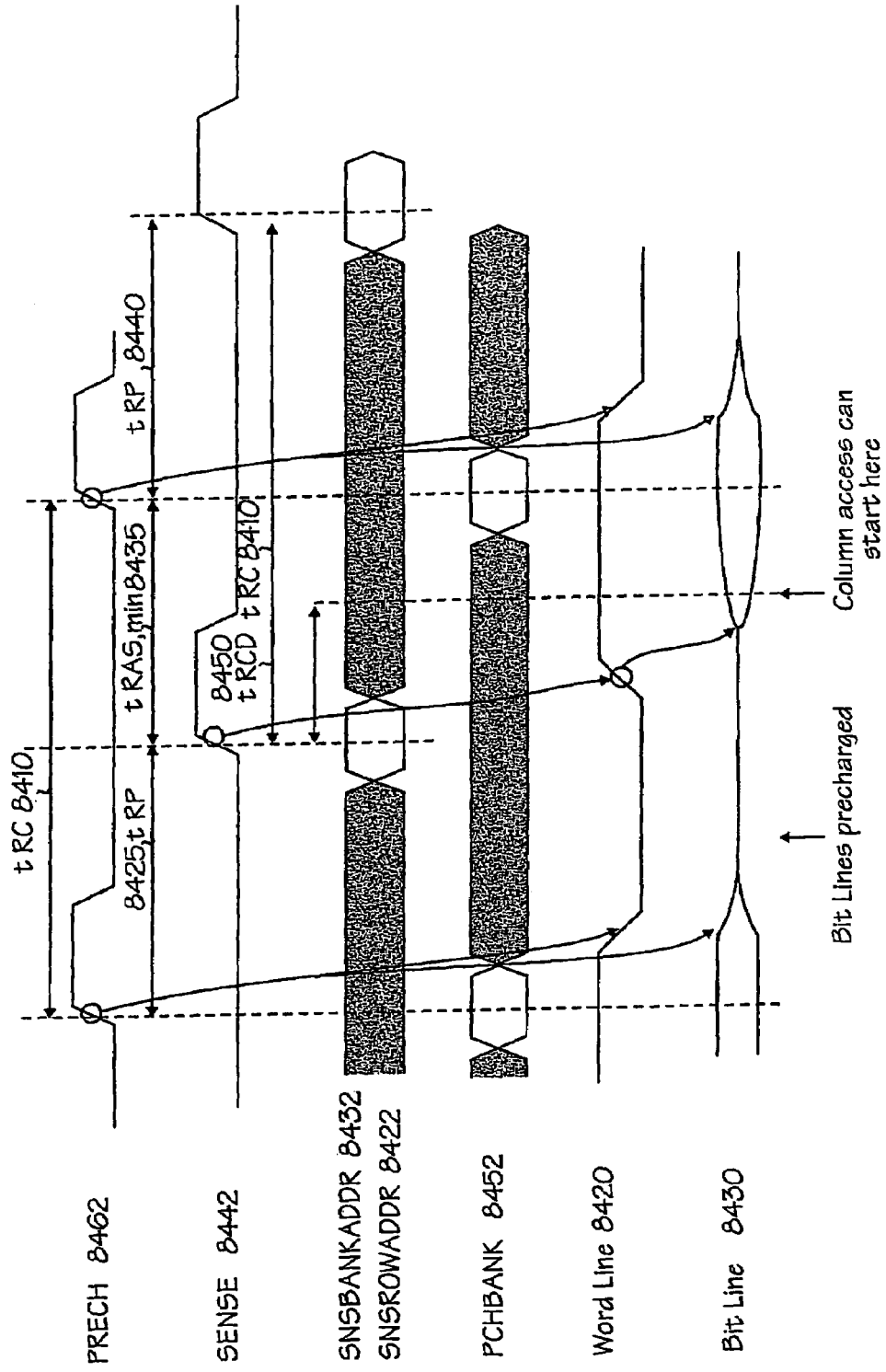
FIG. 8 is the DRAM row timing signal waveforms for the row operation of one embodiment.

FIG. 8 is the DRAM row timing signal waveforms for the row operation of one embodiment. In performing a row access on the memory core, pre-charge signal PRECH 8462 initiates a cycle upon a certain bank PCHBANK 8452 that prepares the bit lines to receive the stored charge, wherein the cycle time is no shorter than parameter tRC 8410. Sense signal 8442 initiates a cycle upon a particular bank SNSBANKADDR 8432 and row SNSROWADDR 8422 to couple the stored charge to the sense amplifiers. Upon receiving the sense signal 8442, a wordline 8420 is activated and a bit line 8430 responds to the stored charge being coupled to it. After a time tRCD 8450, a column access of data in the sense amplifiers may be performed. The sensed data in the sense amplifiers is restored onto the storage cells and another precharge, lasting a time tRP 8425 after tRAS, min 8435, is allowed that again prepares the bit lines for another cycle. It is noted that DRAM timing parameters can vary widely across various memory core designs, manufacturing processes, supply voltage, operating temperature, and process generations. In one embodiment, an access from a core using a precharge before a sense operation takes about 45 nanoseconds (ns) and the cycle takes about 80 ns, wherein the difference of 35 ns is the time to restore the charge on the accessed storage cells.

With reference to FIG. 5, it is noted that multiple banks are shown in the memory core 5100, but the embodiment is not so limited. In particular, bank 5155 has a separate storage array 5145 and set of sense amplifiers 5135. Furthermore, bank 5156 has a separate storage array and set of sense amplifiers. Banks 5155 and 5156 may be independent in the sense that one bank may be carrying out a precharge operation, while the other is performing a sense operation, given sufficient control from row decoder and control 5175. Thus, having multiple banks permits concurrent operation between the banks.

Figure 9:
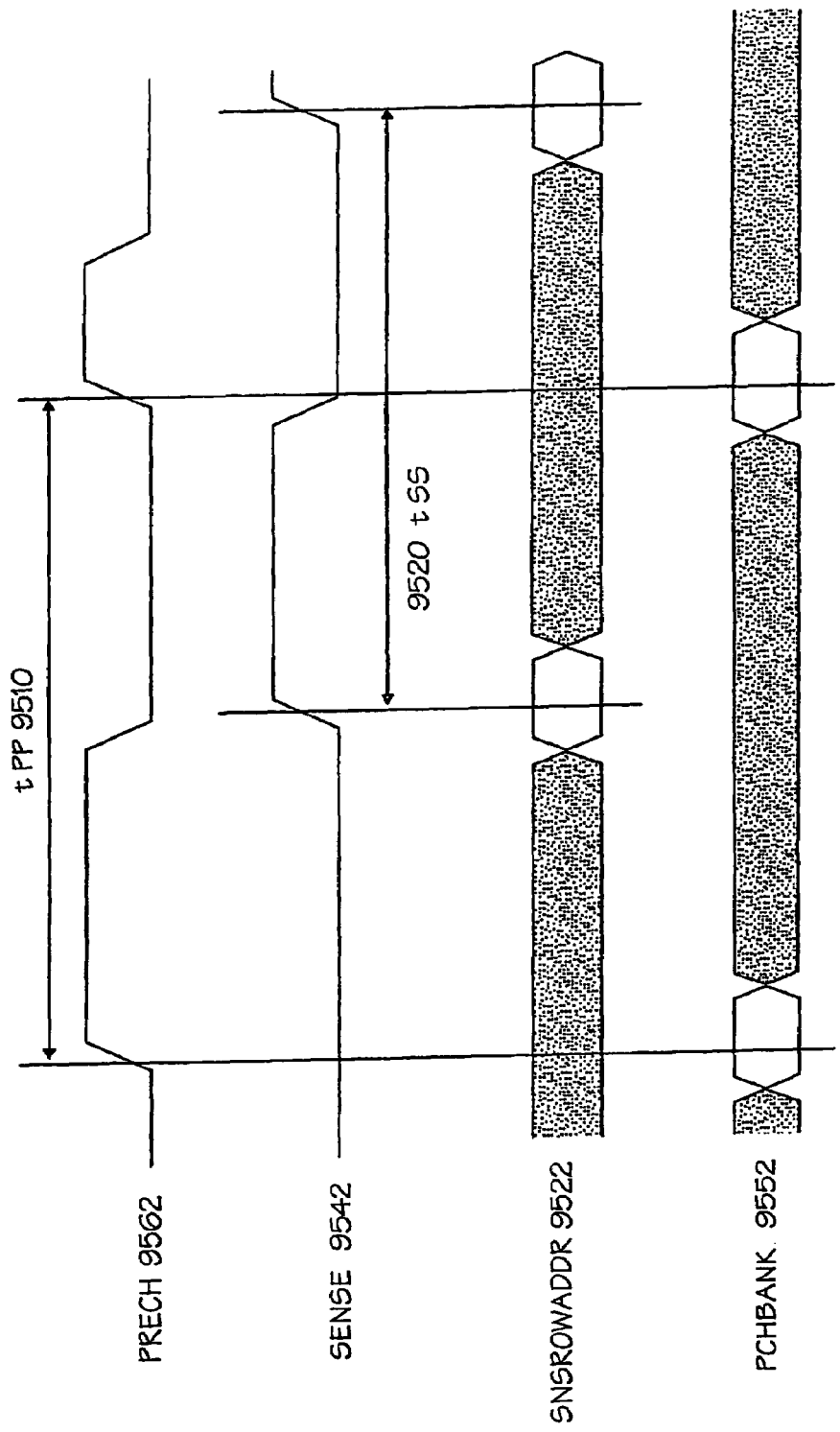
FIG. 9 shows the minimum time between precharge operations and sense operations to different banks of memory in one embodiment.

FIG. 9 shows the minimum time between precharge operations and sense operations to different banks of memory in one embodiment. Parameter tPP 9510 determines the minimum time between precharge operations to different banks in the same device. Parameter tSS 9520 determines the minimum time between sense operations to different banks in the same device. In one embodiment, parameters tPP and tSS are on the order of 10 to 20 ns which is less than the access time from a single bank and smaller than the cycle parameter tRC which applies to a single bank.

Multiple banks may be coupled in some memory cores to other banks, wherein the other banks are adjacent banks, but the embodiment is not so limited. In particular, when a first bank shares a portion of the sense amplifiers with a second bank, the first bank becomes dependent upon the second bank in that the two banks cannot typically be operated concurrently. However, the dependent banks allow a large number of banks in a core without the penalty that might be encountered when using a large number of sense amplifier arrays, many of which may be operated without constraint. Precharging the banks may become more complex because a precharge may be required for each bank, resulting in a large number of precharge operations. However, in one embodiment, the memory core can convert a precharge operation of a first bank into a precharge of the first bank and the banks dependent upon the first bank. In another embodiment, the memory device circuitry can convert a bank precharge into multiple operations.

Figure 10:
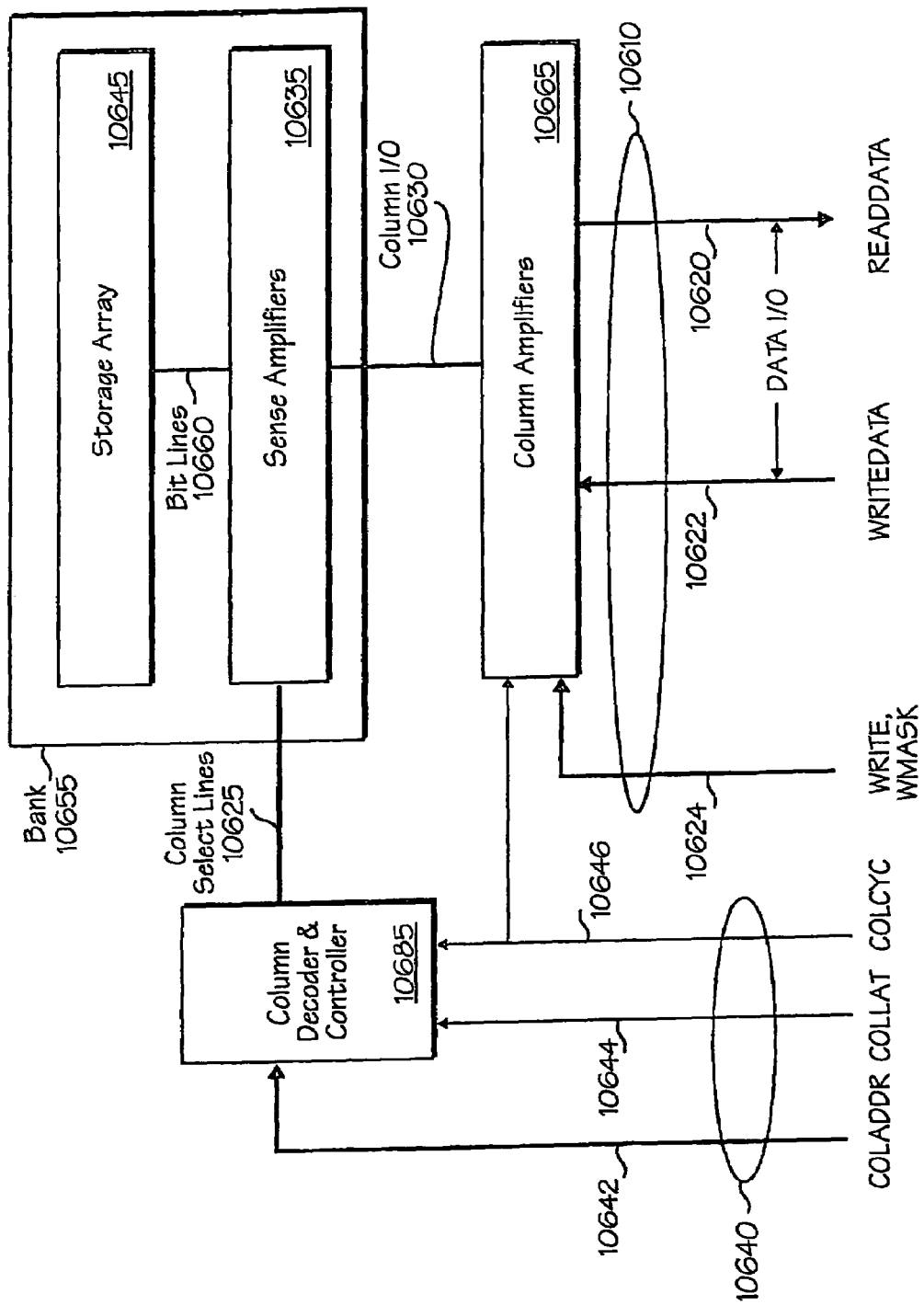
FIG. 10 is the circuitry that supports a column operation in a memory core of one embodiment.

FIG. 10 is the circuitry that supports a column operation in a memory core of one embodiment. Column decoder 10685 receives the column control signals and the column address signals 10640 and drives the column select lines 10625 into the sense amplifiers 10635 to select some or all of the outputs from the sense amplifiers 10635. Sense amplifiers 10635 receive the bit lines 10660 from the storage array 10645, the column select lines 10625 from the column decoder and controller, and the selected amplifiers drive the column I/O lines 10630 into the column amplifiers 10665. Column amplifiers 10665 receive one of the column control signals 10646 from the column control 10640, the write data 10622, and the write mask 10624, but the embodiment is not so limited. Column amplifiers 10665 drive read data 10620 to circuitry external to the memory core. Typically, the column I/O lines 10630 are differential and are sensed by differential column amplifiers in order to speed column access time, but the embodiment is not so limited. In the embodiment of FIG. 10, bidirectional column I/O lines 10630 carry the write data and read data. In an alternate embodiment, column I/O 10630 is unidirectional resulting in separate pathways for write data and read data into and out of the sense amplifiers from the column amplifiers. In another alternate embodiment, I/O WRITEDATA 10622 and READDATA 10620 are separate buses that allow for some concurrency between the sense amplifiers and the column amplifiers, but the embodiment is not so limited. In an alternate embodiment, the data I/O lines are bidirectional, wherein the WRITEDATA 10622 and READDATA 10620 share the same bus. The number of lines in the WRITEDATA bus 10622 and the READDATA bus 10620 determine the amount of data, or column quantum, for each column access from the core. Typical sizes range from 64 bits to 256 bits for each bus, but the embodiment is not so limited.

Figure 11:
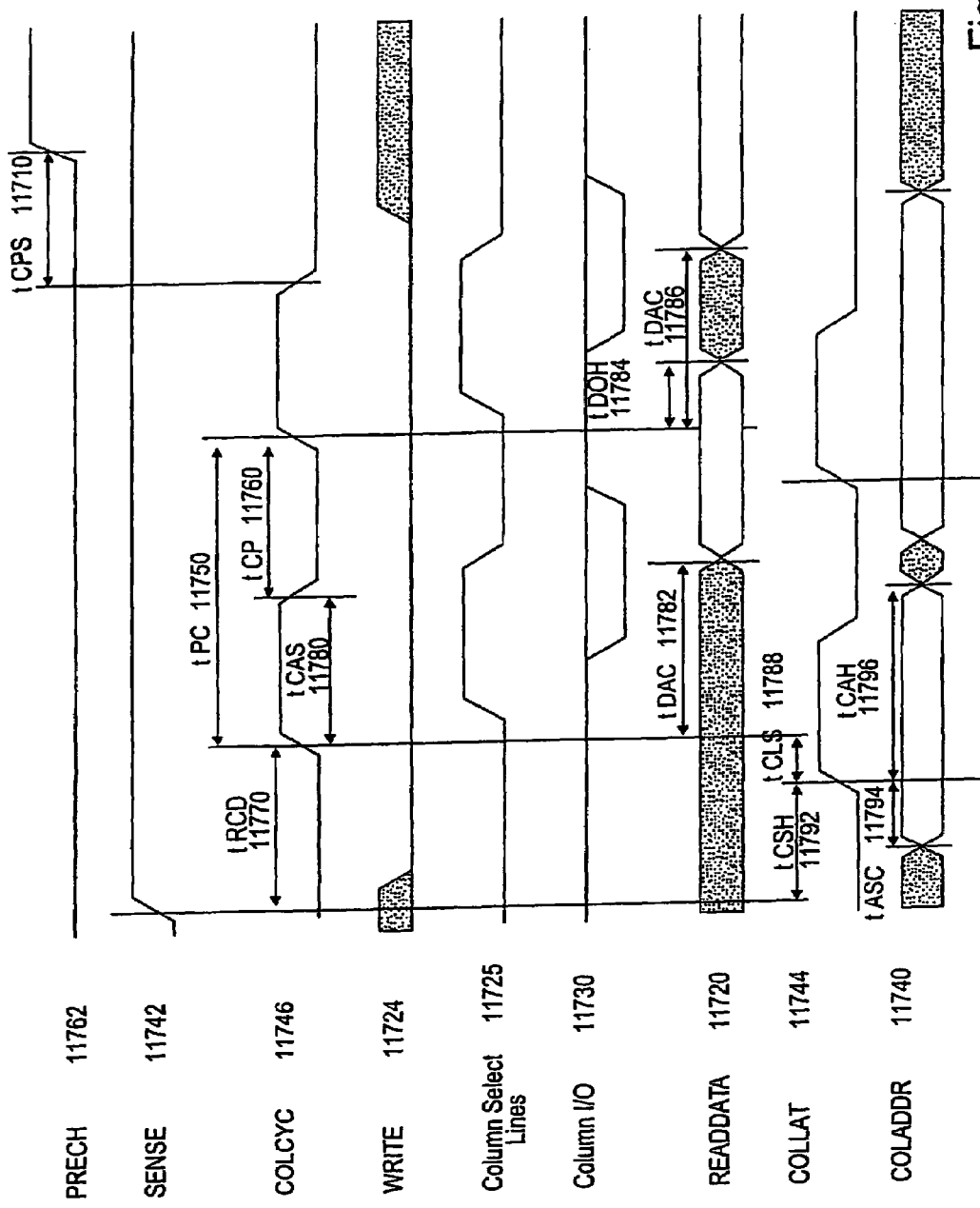
FIG. 11 is the column read timing for a read operation of one embodiment.

FIG. 11 is the column read timing for a read operation of one embodiment. Read operations cycle two signals, COLLAT 11744 and COLCYC 11746, with minimum cycle time tPC 11750. Typically, the column cycle time tPC is about 10 ns, but the embodiment is not so limited. The signal COLLAT 11744 starts slightly ahead of COLCYC 11746 by parameter tCLS 11788 and latches the column address 11740 in the column decoder. This permits the signal COLADDR to be introduced into the column decoder for the next cycle while the data is available on the previous cycle and helps to remove the delay of the column decoder from the access path. The signal COLLAT 11744 follows the SENSE signal with a delay of tCSH. In one embodiment, the signal COLADDR uses set and hold times tASC and tCAH with respect to the COLLAT signal. The signal COLCYC 11746 cycles at the same minimum rate tPC as the COLLAT signal. The availability of read data is a delay tDAC 11782 from the leading edge of the signal COLCYC. The tCAS 11780 is the period of time that signal COLCYC is in the high state, and tCP 11760 is the period of time that signal COLCYC is in the low state.

Figure 12:
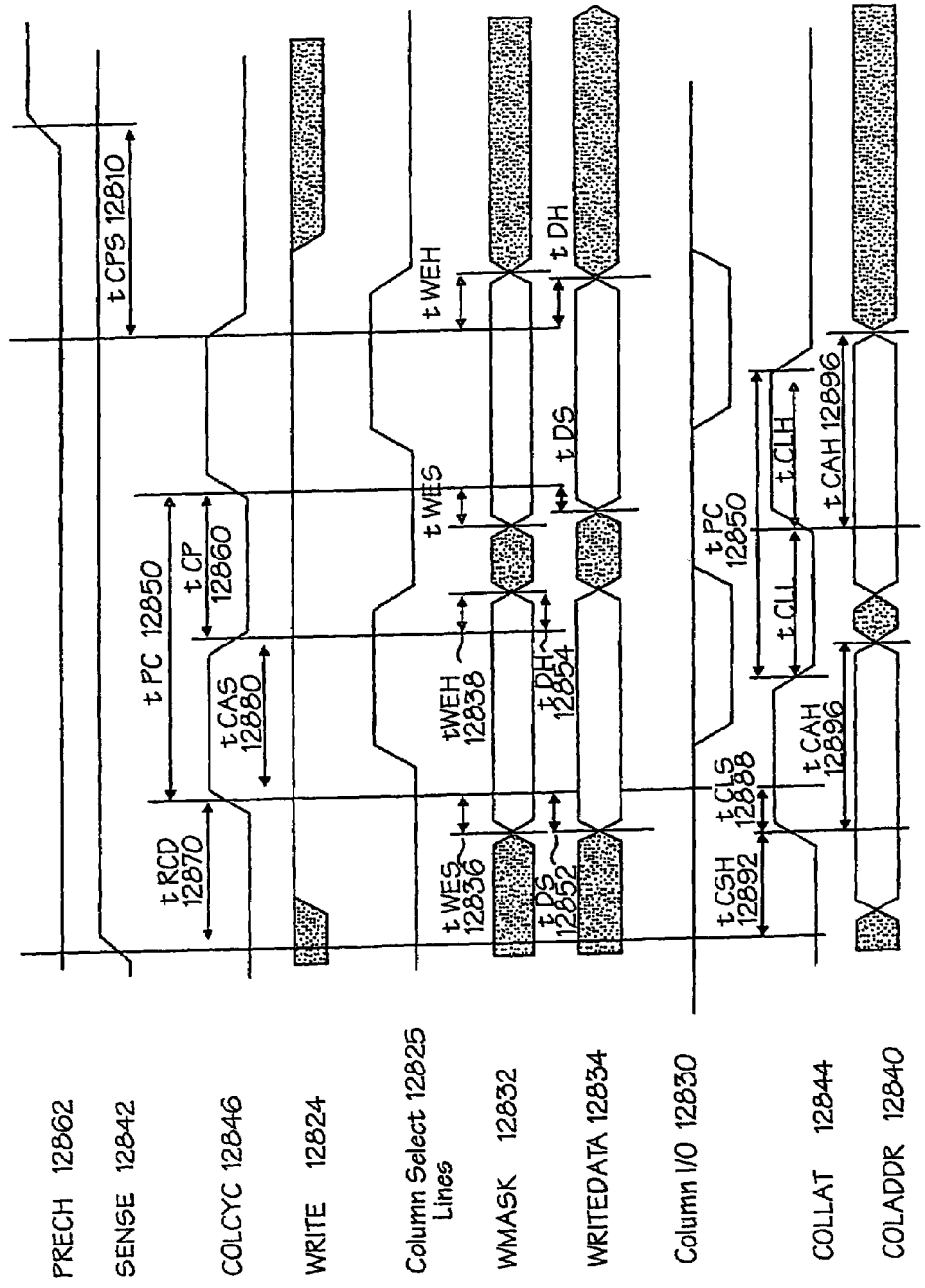
FIG. 12 is the column write timing for a write operation of one embodiment.

FIG. 12 is the column write timing for a write operation of one embodiment. The column write cycle is similar to the read cycle for the signals COLCYC 12846 and COLLAT 12844; the major difference is that the WRITEDATA 12834 should be setup by an amount tDS 12852 prior to the COLCYC signal. Furthermore the WRITEDATA must be held until an mount tDH 12854 after the time tCAS 12880 expires on the COLCYC signal 12846. The WMASK 12832 input has approximately the same timing as the WRITEDATA signal and is governed by parameters tWES 12836 and tWEH 12838. In one embodiment, a column cycle can occur rather quickly compared to a row cycle. Typical column cycle times are about 10 ns as compared to the 80 ns for a row cycle, but the embodiment is not so limited. It may be desirable to maintain a sequence of column quantum accesses at the column cycle rate, under a variety of application reference streams, but the embodiment is not so limited.

A register transaction to a DRAM device begins with the transmission of a Control Register Request packet; this packet is framed with two start bits. This packet contains the Control Register Opcode field, which selects the transaction type. A Control Register Sequence address field selects one of the DRAM devices on the serial chain. If a Control Register Broadcast field is set, then all DRAM devices coupled to the serial chain are selected. A Control Register Address packet follows the Control Register Request packet and contains a 12-bit address for selecting a control register.

A write transaction comprises a Control Register Data packet that contains 16 bits of data that is written into the selected control register. A Control Register Interval packet follows the Control Register Data packet, providing some delay for any side-effects to take place.

A read transaction comprises a Control Register Interval packet followed by a Control Register Data packet. In this manner, a delay is provided during which the selected DRAM device accesses the control register.

In one embodiment, the input and output data pins SIO0 and SIO1 of each DRAM device are dynamically configurable in response to an SIO signal communicated over the serial chain. With reference to FIG. 3, the SIO0 and SIO1 pins are coupled to the SIO command interface 206 through an SIO pin configuration circuit 299. Configuring the SIO pins comprises configuring both the SIO0 and the SIO1 pins as input pins. The SIO signal from the memory controller will arrive at the DRAM device on the input pin. The pin configuration circuit 299 detects the logical high value of the arriving SIO signal on the input pin. Upon detection of the logical high value, the SIO pin configuration circuit enables the output drivers on the pin that did not receive a signal, wherein the pin that did not receive the signal is thereby configured as the output pin. This process continues sequentially down the chain of DRAM devices as the SIO signal is passed among the DRAM devices.

Figure 13:
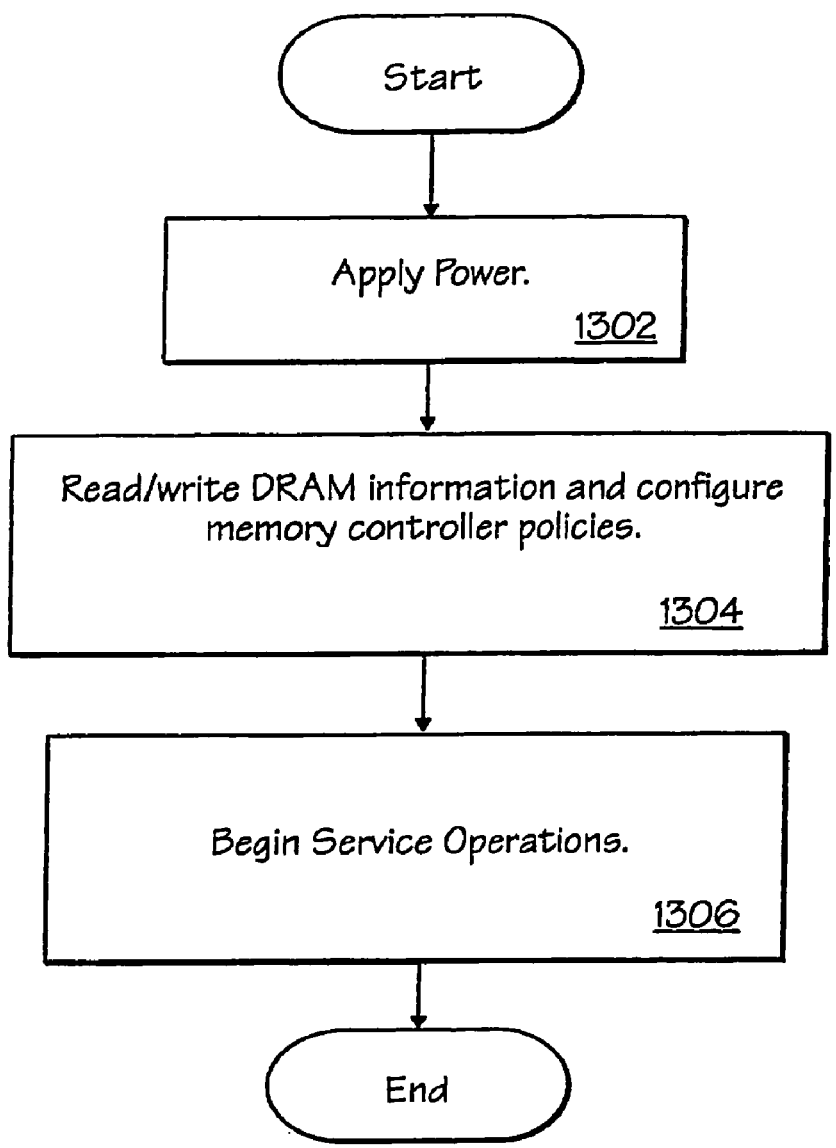
FIG. 13 is a high-level flowchart of the initialization of the DRAM devices of one embodiment.
Figure 14:
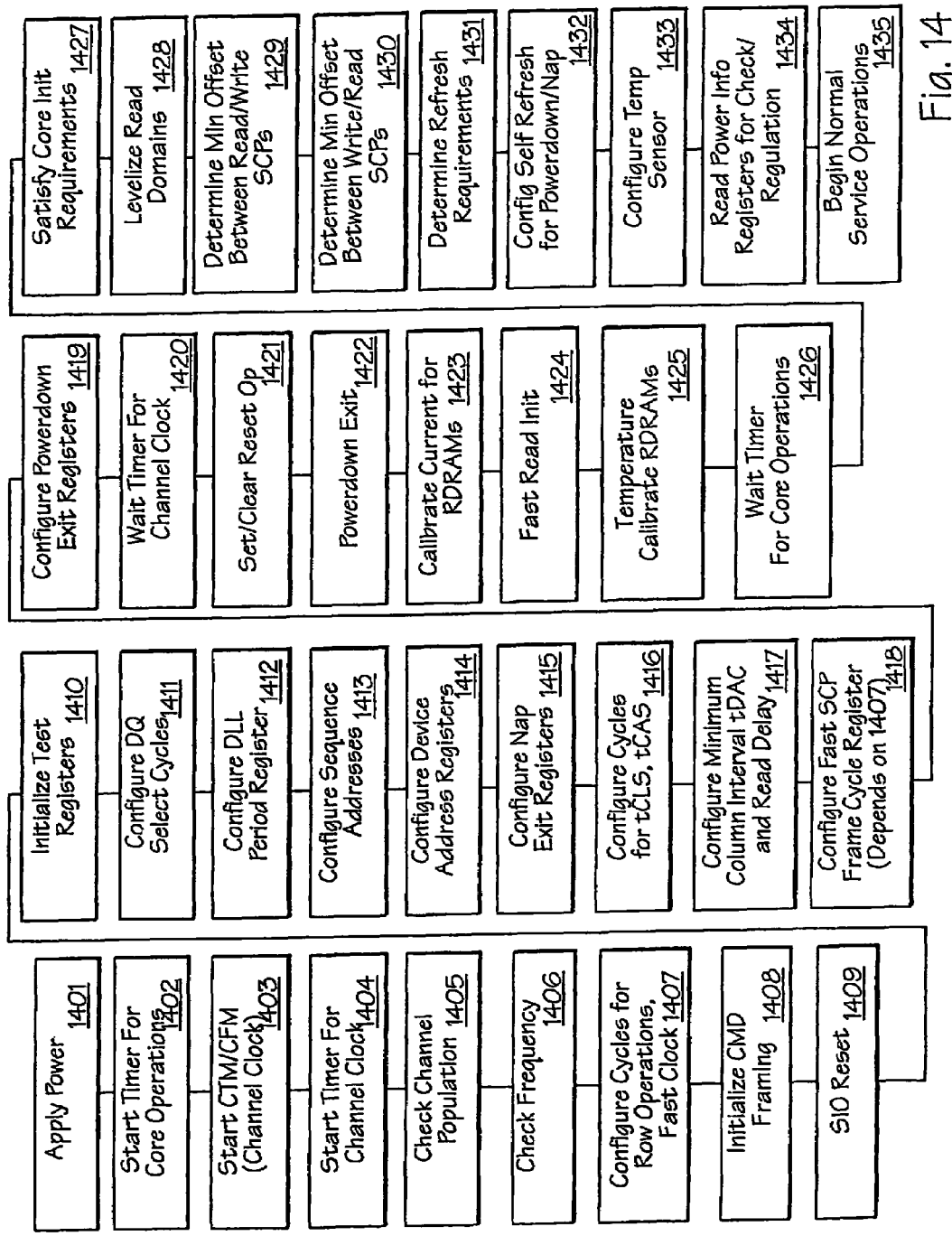
FIG. 14 is a detailed flowchart of the initialization of the DRAM devices of one embodiment.

Initialization refers to the process that a memory controller must go through after power is applied to the memory system or the memory system is reset. The controller prepares a DRAM subsystem comprising DRAM devices for bus operations by using a sequence of control register transactions on the serial CMOS bus, or auxiliary channel. FIG. 13 is a high-level flowchart of the initialization of the DRAM devices of one embodiment. FIG. 14 is a detailed flowchart of the initialization of the DRAM devices of one embodiment.

In one embodiment, the purpose of the initialization sequence is to prepare the DRAM devices for operation, and to gather information about the DRAM devices that enables a memory controller to use the DRAM devices efficiently. With reference to FIG. 13, the sequence of operations involved in initializing the DRAM devices comprise the following steps: apply power 1302; read/write DRAM device information to initialize the DRAM devices, and use information about the DRAM devices to configure the memory controller to achieve desired performance levels 1304; and begin service operations 1306. This sequence of operations shows an ordering of the events that should occur before the initialization process completes. With reference to FIG. 14, the block representing step 1304 comprises steps 1402 through 1434.

With reference to FIG. 14, operation begins at step 1401, at which power is applied to the memory system. Following the application of power, there is an amount of time that should elapse before the DRAM devices can have data written to and read from the core memory. Furthermore, a period of time should elapse before initialization commands can be received and interpreted by the DRAM devices on the SIO pins.

At step 1402, a timer is started for DRAM device core operations. At this step a timer is started that indicates how much time should be allowed to elapse before data can be written to and read from the DRAM devices using the bus, or main channel, and the DRAM device main connection pins. During the course of initialization it may be desirable to write data to the DRAM devices and read it back, and this should not be attempted before the time period indicated by the core operations timer. Core operations should not be attempted before the core operations timer elapses because the core may not be ready electrically to perform read and write operations. The channel clock, or CTM/CFM clock is started, at step 1403. All information passed along the bus, or main channel, between the main connection pins of the memory controller and the DRAM devices is transmitted using this clock. At step 1404, a timer is set to track the amount of time allowed for the channel clock to settle before information passed along the main channel should be sent using the channel clock.

Operation continues at step 1405, at which the channel or bus population is checked or determined. At this step, the number of DRAM devices coupled to the bus is determined. At least one DRAM device should be coupled to the bus, and no more than the maximum number of DRAM devices allowed by the protocol and physical characteristics of the bus should be coupled to the bus. In one embodiment, in order to determine the number of DRAM devices coupled to the channel, configuration information stored in the SPDs indicates the number of DRAM devices on each module, and the sum total determines how many are coupled to the channel. If the maximum number of DRAM devices allowed on the main channel is exceeded, an error is reported. One embodiment allows for as many as 36 DRAM devices to be coupled to the main channel, but the embodiment is not so limited.

It is noted that one embodiment discussed herein uses SPDs. However, the embodiment is not limited to the use of SPDs. In embodiments which do not use SPDs, some information referred to as being stored by the SPDs is stored in registers of the DRAM devices. Other information would have to be known based on manufacturer information or part number information.

The clock frequency is checked, at step 1406. In an embodiment in which the system uses fixed fast and slow clock frequencies, this step is used to check that the devices on the channel can handle the corresponding clock periods. In performing this step, four fields are read from each SPD, wherein two fields pertain to the fast dock and two fields pertain to the slow clock. The two fields pertaining to the fast clock are the tCYC, Min Fast register field and the tCYC, Max Fast register field. If the Fast Clock generator period is less than the value of tCYC, Min Fast read from an SPD, this indicates that the clock generator does not produce a clock with high enough frequency that can be used by the DRAM devices associated with that SPD. Likewise, if the fast clock generator period is greater than the value of tCYC, Max read from an SPD, then this indicates that the clock generator produces a clock with a frequency higher than acceptable to the DRAM devices associated with that SPD. In this case, an error is reported. Furthermore, the corresponding values in the tCYC, Min Slow and tCYC, Max Slow register fields are read and compared against the slow clock period to ensure that the slow clock period of the memory controller fits in this range.

At step 1407, SPD information is read to determine what values will be written into register fields in each DRAM device so that the DRAM device will function properly and efficiently. The SPD information is stored in units of time, but the memory controller and DRAM devices manipulate this information in terms of dock cycles. For each SPD associated with the channel, the values read comprise: tRCD, tRP, tRAS, tSS, and tPP. For each of these values, which are in units of time, the times are converted to fast clock cycles and slow clock cycles. For example, the value of tRCD, in units of time, is converted to units of clock cycles so that a memory controller can use this information in a form which it is accustomed to manipulating. To convert this tiling to clock cycles, the value of tRCD is divided by the clock period. The ceiling function takes any remaining fractional number of cycles and rounds up to the next whole integer cycle, as whole cycles are the smallest unit of time that a controller can use. The formulas for converting to fast clock cycles comprise:

cyc*RCD*spd=ceiling(*tRCD*/{Fast Clock period})

cyc*RP*spd=ceiling(*tRP*/{Fast Clock period})

cyc*RAS*spd=ceiling(*tRAS*/{Fast Clock period})

cyc*SS*spd=ceiling(*tSS*/{Fast Clock period})

cyc*PP*spd=ceiling(*tPP*/{Fast Clock period})

Moreover, the overall system values for each of these parameters are determined. The system value for each parameter is simply the largest SPD value for each of the above calculated values. The memory controller is then configured with these system values. For the slow clock, the same formulas above are used, except that the value of the slow clock period is used as the denominator instead of the fast clock period.

The CMD framing is initialized, at step 1408. This initialization is performed by setting CMD to 0 for two initialization clock cycles.

Operation continues at step 1409, at which the DRAM devices are initialized for subsequent SIO operations. In one embodiment, the repeater register of each DRAM is set to logical 1 to indicate that any incoming data read on the SIO0 pin should be repeated on the output SIO1 pin. In this step, a number of other registers are also set to their defined reset value. Furthermore, internal circuitry is initialized to allow register reads/writes. Upon completion, an SIO reset command is sent to each DRAM device.

At step 1410, uninitialized DRAM device test registers are set to logical 0. This is accomplished by performing a broadcast write with the value of 0 on the SIO channel for each test register field. The broadcast write is a single command that writes the same value to all DRAM devices coupled to the auxiliary channel, but the embodiment is not so limited. At step 1411, registers are set that are indicative of the method for performing device addressing upon exit of low power states. The DLL period register is configured, at step 1412.

Figure 18:
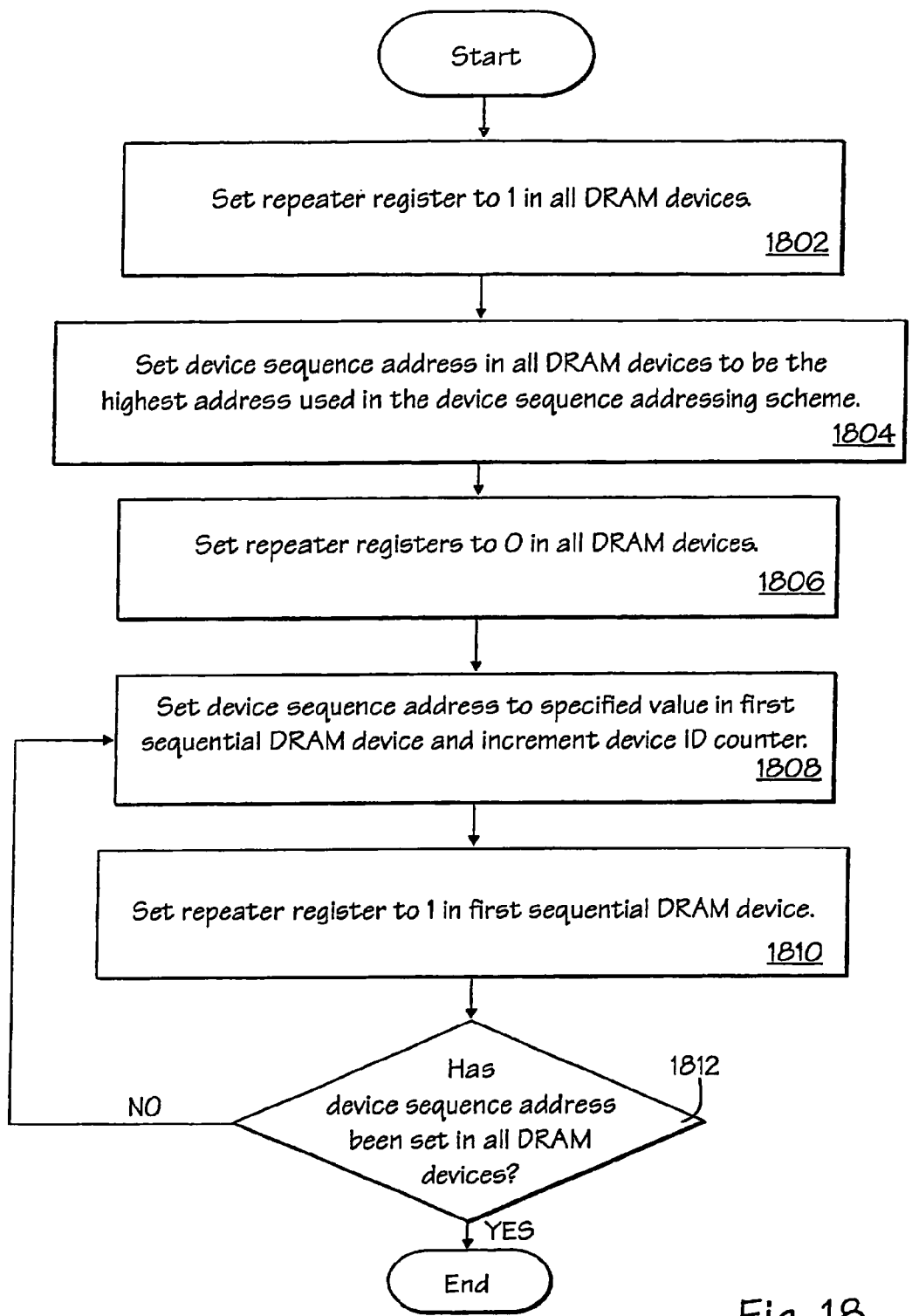
FIG. 18 is a flowchart of the procedure for setting the device sequence addresses in DRAM devices of one embodiment.

Prior to this point in the initialization, communications between the DRAM devices and the memory controller have been performed through broadcast operations in one embodiment. At step 1413, each DRAM device is assigned a unique ID to allow individual devices to be addressed. Furthermore, other registers are configured at this step. Moreover, FIG. 18 is a flowchart of the procedure for setting the device sequence addresses in DRAM devices of one embodiment. To begin, a broadcast write operation is performed to: set the SIO repeater register value to 0, in order to break the DRAM device serial chain; set the Device Sequence Address (DSA), or the unique ID used by a DRAM device during SIO operations, to 31; and, set the Powerdown Self Refresh field to 0, in order to prevent self-refresh before the memory core is ready. In one embodiment, these operations may be performed in a single broadcast write because they are all fields or different dedicated bits in the same register, and registers may be written in one operation.

Following the broadcast write, a counter that indicates the SIO ID for the next device, or seq-id, is set to 0. The sequence addresses, or unique SIO IDs, are then set for each DRAM device. For each DRAM device, the following sequence is performed: an SIO operation is performed to device 31, thereby resetting the Device Sequence Address of device 31 to the value of seq-id; the SIO repeater register is set to 1; the Power Exit Select is set to match whatever policy and physical configuration is being used by the memory controller; the Powerdown Self Refresh field is set to 0; the Reset Power Mode field is set to the proper value to indicate whether fast clock or slow clock will be used for Set/Clear Reset; and, seq-id is incremented so that the next DRAM device receives the next value as its SIO ID.

Operation continues at step 1414, at which a determination is made of the assignment of DRAM devices to address space based on memory controller and system policy. For each SPD, information comprising the following is read: Bank Bits register; Row Bits registers; Column Bits register; Byte Width register; and Dependent Banks register. The Bank Bits register indicates how many bits, or binary digits, are used to uniquely identify one bank in the DRAM. For example, if the device has two banks, then 1 bit is used, while if the device has four banks, 2 bits are used. The Row Bits register indicates how many bits are used to uniquely identify one row in a bank of the DRAM. The Column Bits register indicates how many bits are used to uniquely identify one 16-byte quantity, the minimum unit of information that can be read from a DRAM, from a row of a bank in the DRAM. The Byte Width register indicates whether the data portion of the channel transmits 16 bits of information per clock edge or 18 bits of information per clock edge. The Dependent Banks register indicates whether the DRAM uses dependent or independent banks in its core implementation. After the controller establishes the address configuration, each DRAM device is given an appropriate Device Address.

At step 1415, the Nap Exit registers are configured. The Nap mode is a low power mode in which the DRAM devices may be operated. The tNAP0 and tNAP1 times are the times for the first and second Nap exit phases. When a DRAM device exits the Nap state, the time before the DRAM device can be addressed with commands is based on tNAP1. The tNAP0 describes the period of time before the delay lock loop (DLL) of the DRAM device reaches a predetermined state. For each SPD associated with the channel, the values of tNAP0 and tNAP1 are read and converted to cycles according to the formulas:

$$\mathrm{cyc}NAP0\mathrm{spd}=\mathrm{ceiling}(tNAP0/\{\mathrm{powermode}\ SCK\ \mathrm{period}\})$$

$$\mathrm{cyc}NAP1\mathrm{spd}=\mathrm{ceiling}(tNAP1/\{\mathrm{powermode}\ SCK\ \mathrm{period}\})$$

$$\mathrm{cyc}NAP\mathrm{spd}=\mathrm{cyc}NAP0+\mathrm{cyc}NAP1$$

The system value for NAP, called cycNAPsys, is set as the greatest value of cycNAPspd for all SPDs. Then, for each DRAM device, the Nap Exit Phase 0 register is set to the value of cycNAP0spd derived above from the associated SPD. For each DRAM device, the Nap Exit Phase 1 register is set to the value of (cycNAPsys−cycNAP0spd).

Operation continues at step 1416, at which operational column registers are set to maximum performance with consistent behavior for all DRAM devices. For each SPD, the values of tCLS and tCAS are read and converted to cycles according to the formulas:

$$\mathrm{cyc}CLS\mathrm{spd}=\mathrm{ceiling}(tCLS/\{\mathrm{Fast\ Clock\ period}\})$$

$$\mathrm{cyc}CAS\mathrm{spd}=\mathrm{ceiling}(tCAS/\{\mathrm{Fast\ Clock\ period}\})$$

The values for cycCLSsys and cycCASsys are computed as the greatest of each of the individual cycCLSspd and cycCASspd values from the SPD calculations. Corresponding registers in the DRAM devices are written during the next step. Based on cycCLSsys, the offset for write data packets is determined for use by the memory controller. Corresponding values for cycCLSspd and cycCASspd are computed using the slow clock period in the denominator so that optimal values are used when the slow clock is employed.

During step 1417, each DRAM device is set to respond to a read operation with data on the earliest possible dock cycle. For each SPD associated with the channel, the value of tDAC is read. This value is converted to cycles according to the formula:

$$\mathrm{cyc}DAC\mathrm{spd}=\mathrm{ceiling}(tDAC/\{\mathrm{Fast\ Clock\ period}\})$$

For each DRAM device associated with this SPD, the following registers are set:

tDAC Cycles Fast set to 'cycDACspd' tCLS Cydes Fast set to 'cycCLSsys' tCAS Cycles Fast set to 'cycCASsys'

Corresponding values are computed using the slow clock period in the denominator so that optimal values are used when the slow clock is employed. A broadcast write is issued with the value 0 to the Read Delay register of all DRAM devices.

A Fast SCP Frame Cycle indicates the number of cycles that pass between a PCP that performs a RAS operation and an SCP that performs a CAS operation when the PCP brings a DRAM out of a lower power state into a higher power state. At step 1418, the Fast and Slow SCP Frame Cycles are calculated as:

(1+tRCD−tCLS).

This calculation should use the appropriate values of tRCD and tCLS for fast and slow clock. A broadcast write is performed to all DRAM devices on the auxiliary channel using these values. This step depends on configuring the row parameter cycRCDsys and configuring the column parameter cycCLSsys.

Operation continues at step 1419, at which the 'Powerdown Exit Phase 0' and 'Powerdown Exit Phase 1' registers are set in preparation for initial DLL acquisition. The time periods for the first and second Powerdown exit phases are tPD0 and tPD1, respectively. When a DRAM device exits the Powerdown state, the time period that elapses before the device should be addressed with commands is based on tPD1. The period tPD0 is the length of time before the DLL of the DRAM device reaches a predetermined state. For each SPD associated with the channel, the values of tPD0 and tPD1 are read and converted to cycles according to the formulas:

$$\mathrm{cyc}PD0\mathrm{spd}=64*\mathrm{ceiling}(tPD0/\{\mathrm{powermode}\ SCK\ \mathrm{period}\}/64)$$

$$\mathrm{cyc}PD1\mathrm{spd}=64*\mathrm{ceiling}(tPD1/\{\mathrm{powermode}\ SCK\ \mathrm{period}\}/64)$$

The value for cycPDspd is then set as the sum of cycPD0spd and cycPD1spd, and cycPDsys is set as the greatest value of cycPDspd. For each DRAM device on the channel, write Powerdown Exit Phase 0 register to the value of cycPD0/64, derived above the associated SPD value, and write Powerdown Exit Phase 1 register to the value of (cycPDsys−cycPD0)/64, using the aggregate value from all SPDs and the value for cycPD0 from the SPD associated with this DRAM device. This step precedes any powerdown exit.

At step 1420, a wait is initiated to ensure that the fast clock has settled to within specifications. Internal registers and pipelines are set to states for proper service operation, at step 1421. The DRAM devices are instructed to exit the Powerdown state in order for further initialization to be performed, at step 1422. The current is calibrated, at step 1423, for the DRAM devices. A Fast Read Init command is broadcasted to all DRAM devices on the channel, at step 1424. The device temperature compensation circuits are initialized, at step 1425. A wait is initiated to wait for the core timer to expire, at step 1426, to ensure that tiring constraints are met before core memory operation begin. Core initialization requirements are satisfied, at step 1427.

Operation continues at step 1428, at which the read domains of the DRAM devices are levelized. In one embodiment, the main channel supports up to 32 DRAM devices, but the embodiment is not so limited. However, propagation delays on the main channel are such that a device close to the memory controller responds with data more quickly than a device that at the most distant point on the main channel. As such, a propagation delay from the memory controller to at least one of the DRAM devices may exceed one clock cycle. A memory controller may track the amount of time required for each DRAM device to respond with data, but this requires a great deal of coordination and memory and circuit assets. In one embodiment, the DRAM devices are levelized, or configured, wherein each DRAM device will respond to read commands communicated over the main channel from the memory controller in the same number of clock cycles. Therefore, levelization is the process by which DRAM device registers are configured so that all DRAM devices respond in the same number of clock cycles. While levelization is applicable to DRAM devices that operate at multiple frequencies, as do the DRAM devices of one embodiment, the levelization need only be performed once for each frequency of operation.

The purpose of levelization is to cause all DRAM devices to respond to a read request in the same number of cycles. This is accomplished by delaying the read responses of DRAM devices which are nearer the memory controller and hence, which could respond more quickly to a read request than devices further away from the memory controller since propagation delays to nearer DRAM devices are shorter. While DRAM devices nearer the memory controller have longer response times than the minimum response time, the advantage of levelization is that the memory controller does not need to know which DRAM device a read request is directed towards in order to schedule usage of the wires that form the data bus. Since all levelized DRAM devices respond in the same number of clock cycles, usage of the wires that form the main channel, or data bus, does not depend on which DRAM device data is being read from. If levelization were not performed, the memory controller would have to schedule data bus usage based on which DRAM device data was being read from.

In one embodiment, the levelizing comprises determining the response time of each of the DRAM devices coupled to the bus using information communicated over at least one bus. Each of the DRAM devices coupled to the bus may not operate at the same speed, but the embodiment is not so limited. Determining the response time for a DRAM device comprises writing at least one logic one to at least one memory location of the DRAM device using the bus. Subsequently, a read command is issued over the bus, wherein the read command is addressed to the at least one memory location of the DRAM device. The memory controller then measures the elapsed time between the issuance of the read command and the receipt of the logic one from the memory location of the. DRAM device, and this elapsed time is the response time of the DRAM device. The process is repeated for each DRAM device coupled to the bus and the memory controller.

Following the determination of a response time for each DRAM device coupled to the bus, the individual response times of each of the DRAM devices are evaluated to determine the longest response time. Using the longest response time, a delay is computed for each of the DRAM devices coupled to the bus so that the response time, in dock cycles, of each of the DRAM devices coupled to the bus equals the longest response time. A delay is programmed in at least one register of each of the DRAM devices coupled to the bus by writing values to at least one register of each of the DRAM devices.

In one embodiment, levelizing comprises the following general steps, but the embodiment is not so limited:

1. A normalized value of tCLS, cycCLSsys, and tDAC, cycDACspd, has been computed to be applicable to all the devices.
2. Write all ones data to the first device on the channel.
3. Determine the round trip delay time from the controller's point of view of a read to the first device. The round trip delay comprises two parts: (1) the propagation delay of the read request and read data on the channel; and, (2) the response time of the first device at the device itself. Parameter cycREADrdram is sum of these two times. Parameter cycPROPrdram is the first value and parameter 7+cycCLSsys+cycDACspd is the second value.
4. Compute the first value from the round trip delay and the normalized device values of tCLS and tDAC. This value is to be used later on in determining the minimum offset times between SCP read and write packets.
5. Close the activated row in the first device.
6. Repeat the above steps 2-4 for each device on the channel and collect the data.
7. Determine the longest round trip delay value from the collected data. Store the value in cycREADsys.
8. For each device on the channel determine how much its round trip delay differs from the maximum value and store the difference in the device, so that it responds in the maximum time.

In one embodiment, programming the delay comprises writing delay values to two registers, the read delay register and the tDAC, but the embodiment is not so limited. The delay values of these two registers for each DRAM device will total to the computed delay for the DRAM device. In one embodiment, the tDAC alone is used to control the delay when the delay is short enough to be accommodated by the tDAC; if more delay is needed than can be provided by the tDAC then the fast read delay register is used to provide additional delay. The SIO signals over the auxiliary channel are used to communicate the register delay values to each of the DRAM devices.

Figure 15:
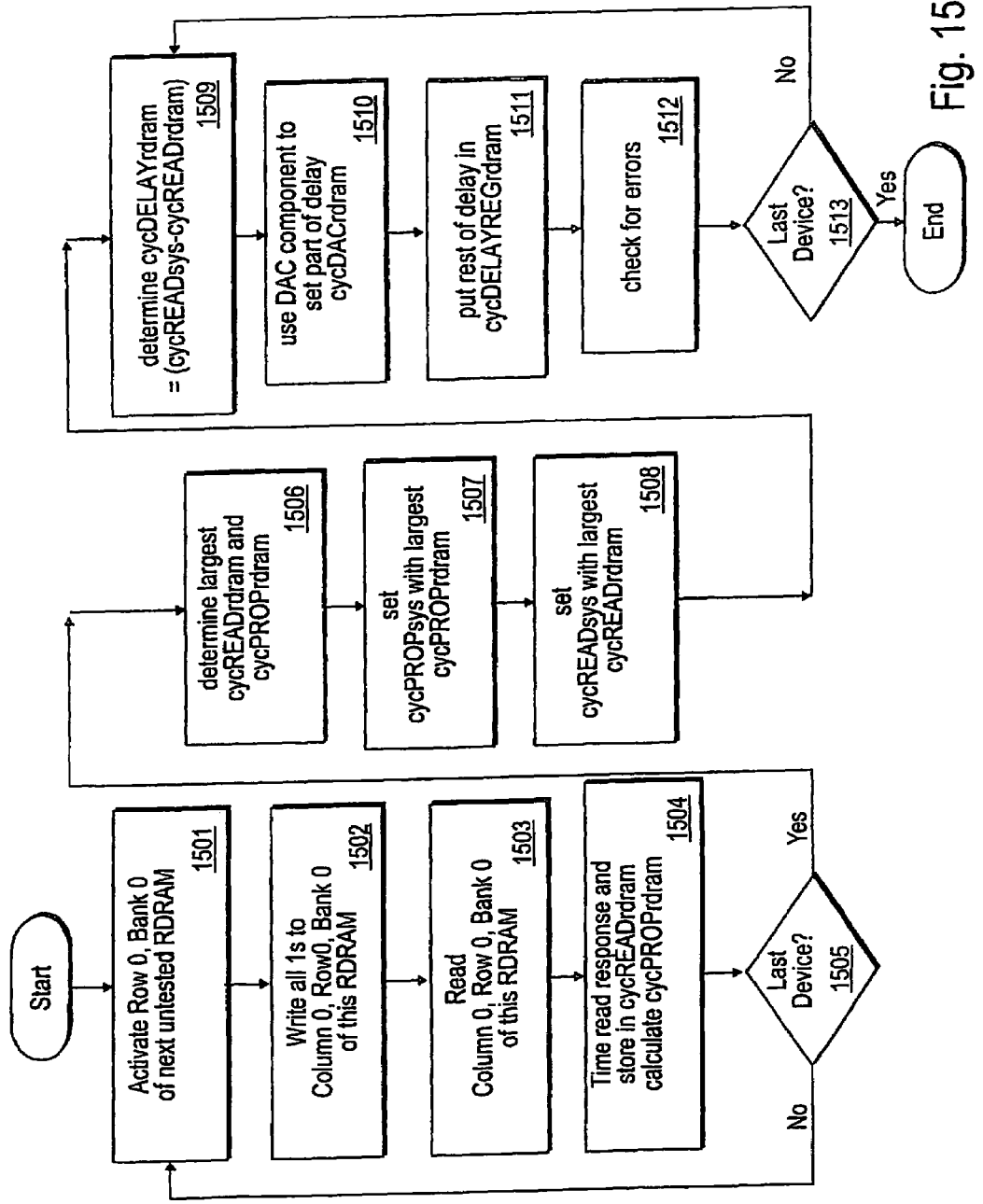
FIG. 15 is a detailed flowchart of the levelization of the DRAM devices of one embodiment.

FIG. 15 is a detailed flowchart of the levelization of the DRAM devices of one embodiment. The following has been performed in previous steps of the initialization: cycCLSsys has been set to the same value in all DRAM devices, as derived from the aggregate of tCLS values; cycDACspd has been set to the minimum possible within each DRAM device from the value of tDAC in the associated SPD. During the levelization of the DRAM devices, the following sub-steps are performed for each DRAM device:

a. Perform an Activate on Bank 0, Row 0 to sense Bank 0, Row 0, at step 1501.

b. Write and Retire a data packet, with all bits set to 1, to Column 0, at step 1502.

c. Read column 0, at step 1503.

d. Note cycREADrdram as the cycle that returns the first 4 bytes of data, as referenced from the beginning of the SCP as cycle 0. Because at this point the length of time for a DRAM device to respond is not known, the memory controller searches the channel for the first set containing logical 1s because this is the data that was written to Bank 0, Row 0, Column 0, at step 1504.

e. At step 1505, a test is made as to whether the DRAM device being levelized is the last DRAM device. If the DRAM device being levelized is not the last DRAM device, operation returns to step 1501. If the DRAM device being levelized is the last DRAM device, operation continues at step 1506, at which the value of the following is noted:

$$cycPROPrdram = cycREADrdram - (7 + cycCLSsys + cycDACspd).$$

f. Precharge Bank 0 and Relax the DRAM device.

g. Based on the values for each DRAM device, cycPROPsys is designated as the largest cycPROPrdram on the channel, at step 1507.

h. Based on the values from each DRAM device, cycREADsys is assigned as the largest cycREADrdram on the channel, at step 1508.

i. At step 1509, determine:

$$cycDELAYrdram = (cycREADsys - cycREADrdram).$$

j. At step 1510, calculate the increase in the tDAC register field to the largest value it can allow, in order to provide as much of the delay needed as possible, using:

$$cycDACrdram = \max(4, (cycDELAYrdram - cycDACspd)).$$

k. At step 1511, provide the balance of the delay with the Read Delay register using:

$$cycDELAYRErdram = cycDELAYrdram - (cycDACrdram - cycDACspd).$$

l. At step 1512, if the cause of the error is that DRAM devices requiring larger tDAC values are at the far end of the channel, then placing them closer to the controller corrects the error. Moreover, a slower frequency, if available, could be used to reduce the number of clock cycles used to create a delay equal to the propagation delay of a signal on the bus. At step 1513, a test is made as to whether the DRAM device being levelized is the last DRAM device. If the DRAM device being levelized is not the last DRAM device, operation returns to step 1509. If the DRAM device being levelized is the last DRAM device, operation ends.

m. Write cycDACrdram to the tDAC Cycles register.

n. Write cycDELAYRErdram to the Read Delay register.

Figure 16:
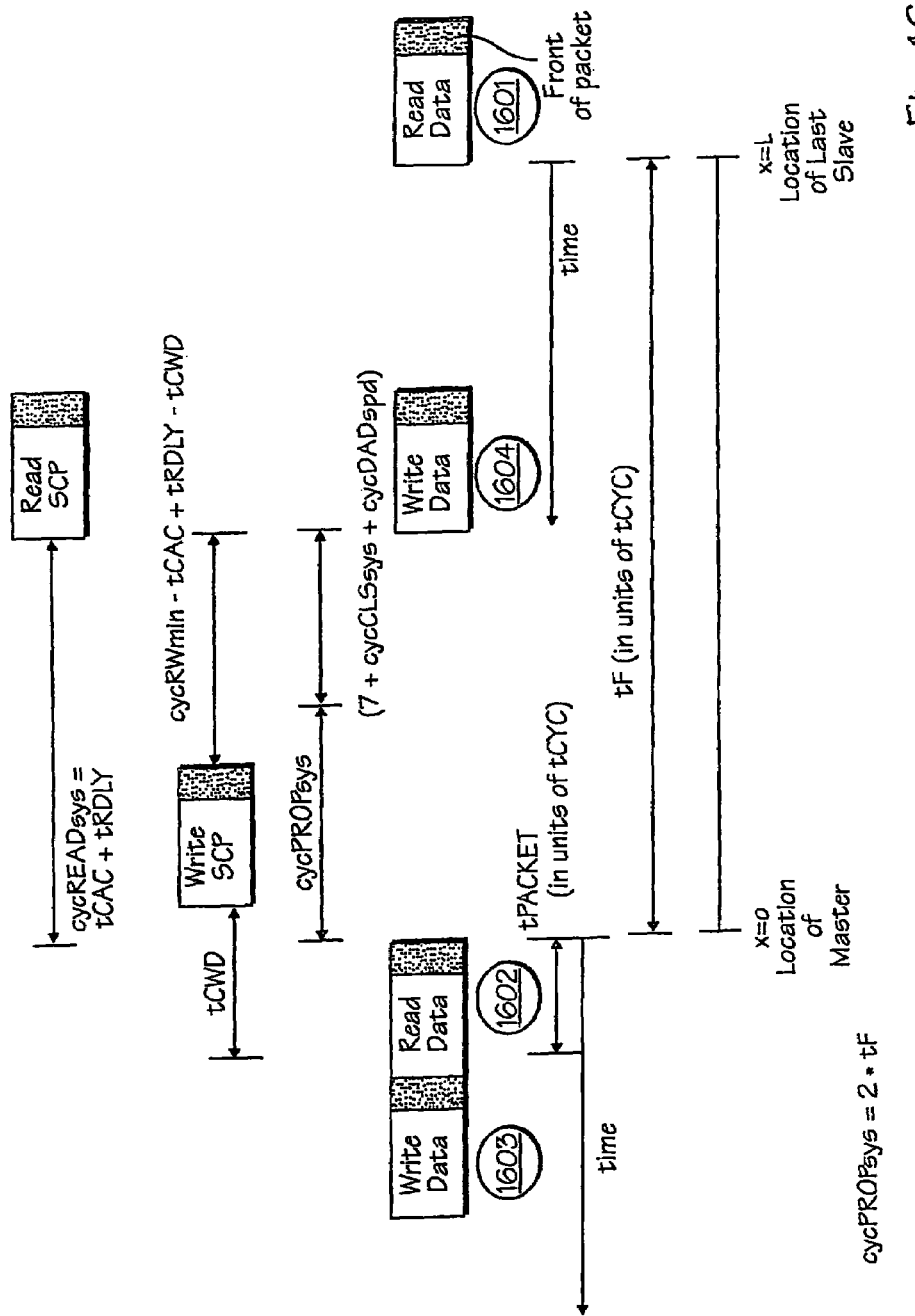
FIG. 16 illustrates the interaction between a Read secondary control packet (SCP) and a subsequent Write SCP of one embodiment.
Figure 17:
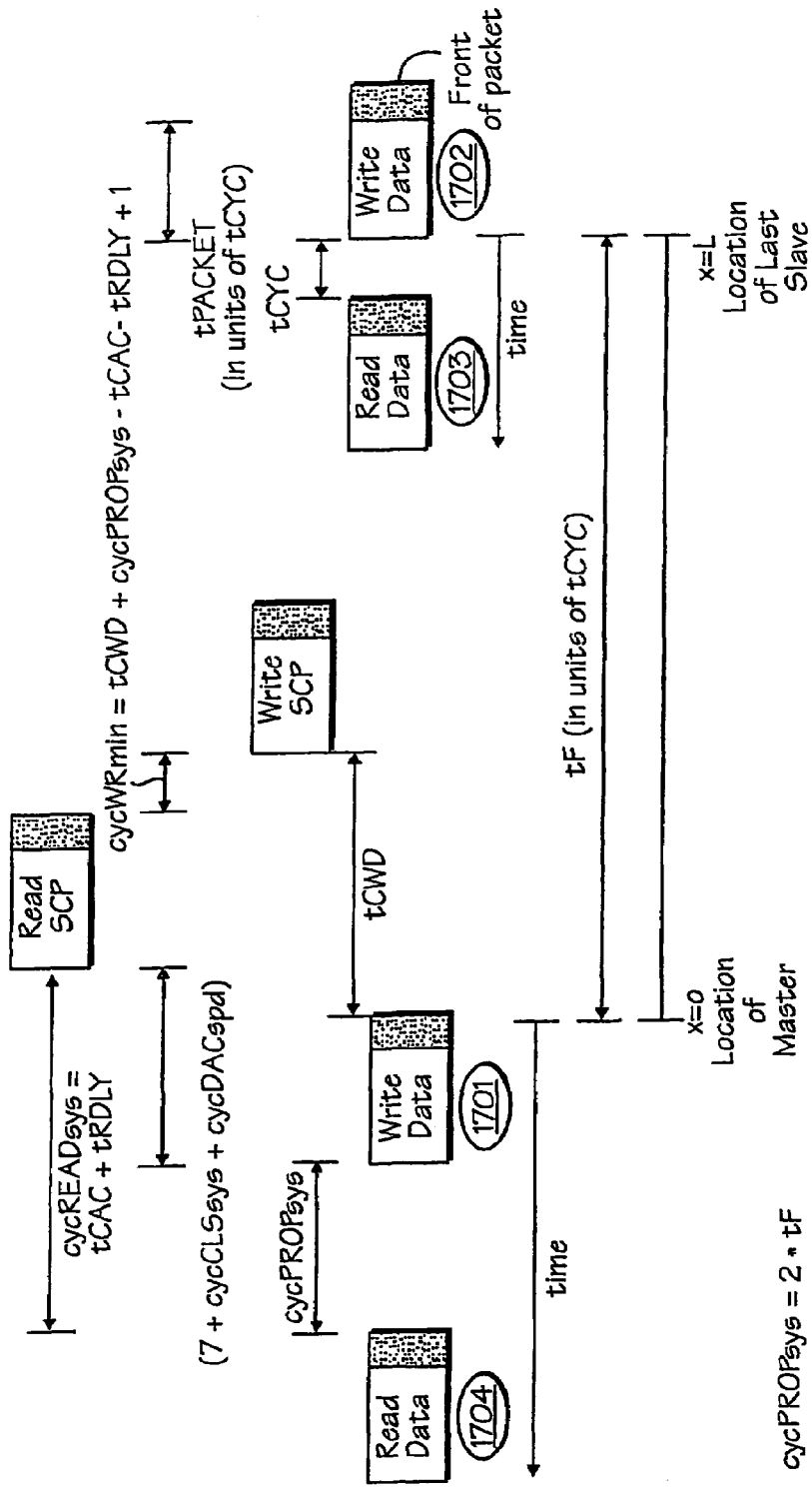
FIG. 17 illustrates the interaction between a Write SCP and a subsequent Read SCP of one embodiment.

In the initialization of the DRAM devices, a minimum clock cycle offset is determined between a read command and a subsequent write command communicated to the DRAM devices over the bus. Furthermore, a minimum clock cycle offset is determined between a write command and a subsequent read command communicated to the DRAM devices over the bus. FIG. 16 illustrates the interaction between a Read SCP and a subsequent Write SCP of one embodiment. FIG. 17 illustrates the interaction between a Write SCP and a subsequent Read SCP of one embodiment. Both operations are specified in terms of SCPs, and these figures show how the distance in time between the corresponding data packets changes depending on the distance between the packets and the master, or memory controller. Both figures show time increasing to the left, with the location of the channel master, a memory controller in one embodiment, placed at location x=0, and the location of the last DRAM, or slave, device at location x=L. Both figures illustrate the interaction between the SCPs and the corresponding data, resulting in minimum separations between Read and Write, and Write and Read, SCPs.

With reference to FIG. 16, Point 1601 illustrates a Read Data packet being returned from a DRAM device that is responding to a Read SCP. The Read Data packet flows down the channel from the right, where the DRAM devices are located, to the left, where the master is located. The separation between the Read SCP and the Read Data, Point 1602, is shown to be equal to the sum of tCAC and tRDLY. The separation between a Write SCP and the Write Data Packet, Point 1603, is shown to be equal to tCWD. For a Write operation, Write Data flows from the master to the DRAM device for which the Write is intended. At the master, it is crucial that the master does not attempt to send Write data towards the DRAM devices while a DRAM device is sending Read data back to the master. To avoid this, the master should wait until the Read Data is completely received before it starts sending Write Data to a DRAM device. This results in the Read and Write Data packets occupying the channel at the master in back-to-back cycles. In order for this constraint to be met, the following relationship should hold:

$$tCAC + tRDLY + tPACKET = cycRWmin + tPACKET + tCWD,$$

where tPACKET is the length of a packet in cycles. This reduces to:

$$cycRWmin = tCAC + tRDLY - tCWD.$$

With reference to FIG. 17, Point 1701 illustrates a Write Data packet being sent to the DRAM device that is furthest from the master. Point 1702 is the Write Data packet being received at the most distant DRAM device. Point 1703 is the subsequent Read Data packet being returned from the most distant DRAM device. In this situation, it is important that the most distant DRAM device not attempt to return Read Data while Write Data is being received. In this case, there should be a one clock cycle separation in time between the Read and Write data at the most distant DRAM device. The separation between the Write SCP and the Write Data, Point 1701, is shown to be equal to tCWD. The separation between the Read SCP and the Read Data, Point 1704, is tCAC+tRDLY. To satisfy these constraints, at the master, the separation between a Write SCP and a subsequent Read SCP should obey the relationship:

$$tCWD + tPACKET + cycPROPsys + tCYC = cycWRmin + tPACKET + tCAC + tRDLY,$$

where tPACKET is simply the length of a packet in cycles. This reduces to:

$$cycWRmin = cycPROPsys + tCWD - tCAC - tRDLY + tCYC.$$

As tCYC is one clock cycle, this reduces to:

$$cycWRmin = cycPROPsys + tCWD - tCAC - tRDLY + 1.$$

It should be noted that in the initialization of the DRAM devices, the levelization step should precede the SCP offset calculation step. The reason is that important information is collected during the levelization step that could not otherwise be obtained for the offset process. This information comprises the cycPROPsys parameter, which is discovered in the levelization process. In fact even if no levelization were to occur, similar calculations would still have to be performed to find the values of cycPROPsys. Furthermore if levelization had not occurred, the offset calculation would be different for each device on the bus. As it happens in one embodiment, the calculation is the same regardless of which DRAM devices receive the SCPs because all DRAM devices appear to the memory controller to be in the same physical location.

Operation continues at step 1429, at which the minimum offset is determined between a read SCP and a subsequent write SCP. A command to perform a read followed by a command to perform a write to the same or different DRAM devices should be separated by some number of channel clock cycles. This offset is determined by column cycle times and is established according to the following formula:

$$cycRWmin = tCAC + tRDLY - tCWD.$$

Operation continues at step 1430, at which the minimum offset is determined between a write SCP and a subsequent read SCP. A command to perform a write followed by a command to perform a read to the same or different DRAM devices should be separated by some number of channel cycles. This offset is determined by two factors: turnaround constraints, based on propagation delays to the most distant DRAM devices; and the offset between Read/Write SCPs as determined at step 1429. The offset between Write and Read SCPs is determined according to the formula:

$$cycWRmin = cycPROPsys + tCWD - tCAC - tRDLY + 1.$$

Refresh requirements for the DRAM device cores are determined, at step 1431. At step 1432, the self refresh is configured and enabled for the power saving modes. The temperature sensor output is configured, at step 1433, so it can be enabled or disabled. The fields in each SPD are read, at step 1434, so that the memory controller can establish a power control policy. At step 1435, power modes of the DRAM devices are configured according to the desired memory controller policy. Timers are then started to indicate when Refresh operations need to be performed. The time value for maximum time a device may be in Nap mode is also initialized. Following completion of step 1435, initialization is complete.

In operation, each DRAM device of one embodiment may be assigned two addresses, wherein the addresses may be provided to registers of the DRAM device over the serial chain, but the embodiment is not so limited. One of the addresses, the device sequence address, is used to address the corresponding DRAM device during initialization operations. The other address, the operating mode address, is used to address the corresponding DRAM device during memory access operations. The device sequence addresses may be sequential, but the embodiment is not so limited. The operating mode addresses are determined by the user when the memory device array is configured, as it is desirable to assign specific DRAM devices specific memory locations of the module address space.

FIG. 18 is a flowchart of the procedure for setting the device sequence addresses in DRAM devices of one embodiment. This procedure was discussed herein with reference to step 1413 of FIG. 14. This flowchart is for a memory array containing 32 DRAM devices, but the embodiment is not so limited. Operation begins at step 1802, at which the repeater register is set to 1 in all of the DRAM devices. The repeater register, when set to 1, is considered to be on and, as such, will place any signal received on the SIO input pin onto the SIO output pin of the DRAM device, thereby propagating the received signal, but the embodiment is not so limited. The repeater register, when set to 0, is considered to be off and, as such, will not place the signal received on the SIO input pin onto the SIO output pin, but the embodiment is not so limited. At step 1804, the device sequence address of all DRAM devices is set to be the highest address used in the device sequence addressing scheme. For example, where the array contains 32 DRAM devices and the sequential address scheme uses addresses 0 through 31, the device sequence address of all DRAM devices is set to 31. If some other address scheme is used to address the DRAM devices, or if the memory array comprises some other number of DRAM devices, the device sequence address set at step 1804 would be correspondingly different.

As previously discussed herein, initialization sometimes results in having the same commands broadcasted to all DRAM devices of the serial chain. At this point in the device sequence address setting procedure, commands may be broadcasted to all DRAM devices simultaneously because all DRAM devices have the same device sequence address and all DRAM devices have the repeaters on, thereby allowing the command to propagate to all DRAM devices of the auxiliary channel. The remainder of the procedure is used to set different device sequence addresses in each of the DRAM devices of the auxiliary channel.

The repeater register is set to 0 in all of the DRAM devices, at step 1806, thereby turning the repeater off. At step 1808, the device sequence address of the first sequential DRAM device, or the DRAM device in closest proximity to the memory controller, is set to the address specified by the device sequence addressing scheme. For example, if device sequence addresses 0 to 31 are used, the device sequence address of the DRAM device in closest proximity to the memory controller is set to 0. As the repeater register is off at this point, this device sequence address is not propagated to other DRAM devices of the serial chain. Furthermore, at step 1808, the device ID counter is incremented. At step 1810, the repeater register of the DRAM device having a device sequence address set at step 1808 is set to 1. Steps 1808 and 1810 are repeated for all DRAM devices coupled to the auxiliary channel until all DRAM devices have an assigned device sequence address. As the repeater register of the first DRAM device on the auxiliary channel is on, the specified device sequence address for the second, or next sequential, DRAM device down the auxiliary channel from the memory controller is set when step 1808 is repeated. The repeater register is set to 1 in the second DRAM device, at step 1810. At step 1812, a determination is made whether device sequence addresses have been set in all DRAM devices of the auxiliary channel. Operation ceases when device sequence addresses are set in all DRAM devices; otherwise, the procedure continues to set a device sequence address in a DRAM device and turn the repeater on so that the next serial signal will reach the next DRAM device in sequence.

The invention has been described in conjunction with the preferred embodiment. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A memory module comprising:
   an integrated circuit memory device including:
   a memory array to store data,
   an interface to receive an instruction to exit a power down mode; and
   a register to store a value representative of a period of time to elapse between exiting from the power down mode and a time at which the integrated circuit memory device is capable of receiving a command to access the data; and
   a storage device to store a plurality of parameter information that pertains to the integrated circuit memory device, the value to be based on at least a first parameter information of the plurality of parameter information.

2. The memory module of claim 1, wherein, while in the power down mode, the integrated circuit memory device consumes less power than after exiting the power down mode.

3. The memory module of claim 1, wherein the memory array includes an array of dynamic random access memory cells, wherein the integrated circuit memory device includes a set of sense amplifiers, wherein the command is a row activate command, and wherein data corresponding to a row of the array of dynamic random access memory cells is transferred to the set of sense amplifiers in response to the row activate command.

4. The memory module of claim 3, wherein the interface of the integrated circuit memory device includes a set of pins to receive a write command after receiving the row activate command, wherein the integrated circuit memory device inputs data to be written to the row of the array of dynamic random access memory cells in response to the write command.

5. The memory module of claim 3, wherein the interface of the integrated circuit memory device includes a set of pins to receive a read command after receiving the row activate command, wherein the integrated circuit memory device outputs read data, selected from the data transferred to the set of sense amplifiers, in response to the read command.

6. The memory module of claim 1, wherein the integrated circuit memory device includes a lock loop circuit to synchronize transfers of the data, wherein the lock loop circuit senses and tracks edges of an external clock signal to synchronize the transfers of the data, wherein the lock loop circuit reaches a predetermined state when exiting the power down mode.

7. The memory module of claim 6, wherein the predetermined state is based on when the lock loop circuit acquires synchronization with the external clock signal.

8. The memory module of claim 6, wherein the predetermined state is based on when the integrated circuit memory device is ready to receive the command.

9. The memory module of claim 1, wherein the storage device is a serial presence detect device.

10. The memory module of claim 1, wherein the plurality of parameter information includes:
information that represents a time to sense a row of the integrated circuit memory device;
information that represents a time between a row access operation of the integrated circuit memory device and a column access operation of the integrated circuit memory device;
information that represents a time between a row access operation of the integrated circuit memory device and a precharge operation of the integrated circuit memory device; and
information that represents a time between a row sense operation applied to a first bank of the integrated circuit memory device and a row sense operation applied to a second bank of the integrated circuit memory device.

11. A system comprising:
an integrated circuit memory device including:
a memory array;
a register circuit to store a value representative of a period of time to elapse before the integrated circuit memory device is ready to receive a command when recovering from a power down mode, wherein the command specifies an access to the memory array;
a delay lock loop circuit to synchronize data transfers using an external clock signal, wherein the delay lock loop circuit reacquires synchronization with the external clock signal during the period of time;
a storage area to store a parameter information that pertains to the integrated circuit memory device, the value to be derived from the parameter information; and
a memory controller device, coupled to the integrated circuit memory device, the memory controller device to provide the value to the integrated circuit memory device.

12. The system of claim 11, wherein the delay lock loop circuit reaches a predetermined state when exiting the power down mode, wherein the integrated circuit memory device is ready to receive the command upon reaching the predetermined state.

13. The system of claim 12, wherein the predetermined state is based on when the delay lock loop circuit acquires synchronization with the external clock signal.

14. The system of claim 11, wherein, while in the power down mode, the integrated circuit memory device consumes less power than in a full power mode, wherein the integrated circuit memory device receives the command while in the full power mode.

15. The system of claim 11, wherein the register circuit includes:
a first register to store first information that is representative of a first period of time in which the delay lock loop circuit acquires synchronization with the external clock signal such that a first amount of functionality of the integrated circuit memory device is achieved; and
a second register to store second information that is representative of a second period of time in which the delay lock loop acquires synchronization with the external clock signal such that a second amount of functionality of the integrated circuit memory device is achieved, wherein the second amount of functionality is greater than the first amount of functionality, wherein the period of time that elapses before receiving the command is an aggregate of the first period of time and the second period of time.

16. The system of claim 15, wherein the value is derived by summing the first period of time, expressed as a first number of clock cycles of the external clock signal, with the second period of time, expressed as a second number of clock cycles of the external clock signal, wherein:
the first number of clock cycles is based on the first period of time divided by a period of the external clock signal; and
the second number of clock cycles is based on the second period of time divided by the period of the external clock signal.

17. The system of claim 16, wherein the integrated circuit memory device is in the power down mode during initialization of the integrated circuit memory device, wherein the initialization is conducted in accordance with a first clock frequency and the integrated circuit memory device is operable in accordance with a second clock frequency during memory access operations, wherein the first clock frequency is lower than the second clock frequency.

18. The system of claim 11, wherein the integrated circuit memory device further includes an interface to receive an instruction to exit the power down mode from the memory controller device.

19. The system of claim 11, wherein the storage area and the integrated circuit memory device are disposed on a memory module, wherein the storage area is a serial presence detect.

20. The system of claim 11, wherein the memory controller device receives the parameter information from the storage area, wherein the parameter information represents a timing parameter of the integrated circuit memory device in units of time, the memory controller device to convert the parameter information that represents the timing parameter from units of time to units of clock cycles of a clock signal to derive the value.

21. The system of claim 11, wherein the parameter information includes:
   information that represents a time to sense a row of the integrated circuit memory device;
   information that represents a time between a row access operation of the integrated circuit memory device and a column access operation of the integrated circuit memory device;
   information that represents a time between a row access operation of the integrated circuit memory device and a precharge operation of the integrated circuit memory device;
   information that represents a time between a row sense operation applied to a first bank of the integrated circuit memory device and a row sense operation applied to a second bank of the integrated circuit memory device; and
   information that represents a time between a precharge operation applied to a first bank of the integrated circuit memory device and a precharge operation applied to a second bank of the integrated circuit memory device.

22. The system of claim 11, wherein the memory controller device is configured in accordance with the parameter information.

23. A system comprising:
   a random access integrated circuit memory device having a memory array, the random access integrated circuit memory device having an interface to receive an instruction to exit a power down mode;
   a storage location to store information representing a timing parameter pertaining to the random access integrated circuit memory device; and
   an integrated circuit device to generate a value representative of a period of time that elapses before the random access integrated circuit memory device receives a read command once the instruction to exit the power down mode has been received, wherein the read command instructs the random access integrated circuit memory device to output data.

24. The system of claim 23, wherein the storage location is included along with the random access integrated circuit memory device on a memory module, and wherein the storage location is included in a serial presence detect.

25. The system of claim 23, wherein the random access integrated circuit memory device includes:
   a clock receiver to receive an external clock signal; and
   a delay lock loop circuit to synchronize data output in response to the read command, wherein the delay lock loop circuit establishes synchronization with an external clock signal during the period of time.

26. The system of claim 25, wherein the delay lock loop circuit reaches a predetermined state while exiting the power down mode, wherein the random access integrated circuit memory device is ready to receive the read command upon reaching the predetermined state, wherein the predetermined state is based on when the delay lock loop circuit establishes synchronization with the external clock signal.

27. The system of claim 25, wherein the random access integrated circuit memory device includes:
   a first register to store coarse biasing information that is associated with a first period of time during which the delay lock loop circuit acquires the external clock signal such that a limited functionality of the random access integrated circuit memory device is achieved; and
   a second register to store fine biasing information that is associated with a second period of time during which the delay lock loop circuit acquires the external clock signal such that a full functionality of the random access integrated circuit memory device is achieved.

28. The system of claim 27, wherein the period of time that elapses before receiving the read command is an aggregate of the first period of time and the second period of time.

29. The system of claim 23, wherein the value is selected by dividing the period of time by a period of an external clock signal to select the value in terms of clock cycles of the external clock signal.

30. The system of claim 29, wherein the value is selected and rounded to a next whole number when a fractional number of clock cycles results when dividing the period of time by the period of the external clock signal.

* * * * *